United States Patent
Yang et al.

(10) Patent No.: US 11,114,547 B2
(45) Date of Patent: Sep. 7, 2021

(54) FIELD EFFECT TRANSISTOR WITH NEGATIVE CAPACITANCE DIELETRIC STRUCTURES

(71) Applicant: Taiwan Semiconductor Manufacturing Co., Ltd., Hsinchu (TW)

(72) Inventors: Chansyun David Yang, Shinchu (TW); Keh-Jeng Chang, Shinchu (TW); Chan-Lon Yang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/573,334

(22) Filed: Sep. 17, 2019

(65) Prior Publication Data

US 2021/0083074 A1    Mar. 18, 2021

(51) Int. Cl.
| | | |
|---|---|---|
| *H01L 29/66* | (2006.01) | |
| *H01L 29/423* | (2006.01) | |
| *H01L 29/49* | (2006.01) | |
| *H01L 29/51* | (2006.01) | |
| *H01L 29/06* | (2006.01) | |
| *H01L 29/40* | (2006.01) | |
| *H01L 29/78* | (2006.01) | |
| *H01L 21/311* | (2006.01) | |
| *H01L 21/3065* | (2006.01) | |
| *H01L 21/02* | (2006.01) | |

(52) U.S. Cl.
CPC .... *H01L 29/66553* (2013.01); *H01L 29/0653* (2013.01); *H01L 29/408* (2013.01); *H01L 29/42392* (2013.01); *H01L 29/4908* (2013.01); *H01L 29/517* (2013.01); *H01L 29/6653* (2013.01); *H01L 29/6681* (2013.01); *H01L 29/66545* (2013.01); *H01L 29/7853* (2013.01); *H01L 21/0228* (2013.01); *H01L 21/02181* (2013.01); *H01L 21/3065* (2013.01); *H01L 21/31111* (2013.01); *H01L 21/31116* (2013.01)

(58) Field of Classification Search
CPC .......... H01L 29/66553; H01L 29/0653; H01L 29/408; H01L 29/42392; H01L 29/4908; H01L 29/517; H01L 29/6653; H01L 29/66545
See application file for complete search history.

(56) References Cited

U.S. PATENT DOCUMENTS

| | | |
|---|---|---|
| 9,093,530 B2 | 7/2015 | Huang et al. |
| 9,105,490 B2 | 8/2015 | Wang et al. |
| 9,171,929 B2 | 10/2015 | Lee et al. |

(Continued)

*Primary Examiner* — Marc Anthony Armand
(74) *Attorney, Agent, or Firm* — Sterne, Kessler, Goldstein & Fox P.L.L.C.

(57) ABSTRACT

The structure of a semiconductor device with negative capacitance (NC) dielectric structures and a method of fabricating the semiconductor device are disclosed. A method of fabricating the semiconductor device includes forming a fin structure with a fin base portion and a fin top portion on a substrate, forming a spacer structure in a first region of the fin top portion, and forming a gate structure on a second region of the fin top portion. The spacer structure includes a first NC dielectric material and the gate structure includes a gate dielectric layer with a second NC dielectric material different from the first NC dielectric material.

20 Claims, 16 Drawing Sheets

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 2017/0250261 A1* | 8/2017 | Kim ................ H01L 29/66742 |
| 2020/0044087 A1* | 2/2020 | Guha ............... H01L 29/42392 |
| 2020/0287039 A1* | 9/2020 | Bi ....................... H01L 29/785 |

\* cited by examiner

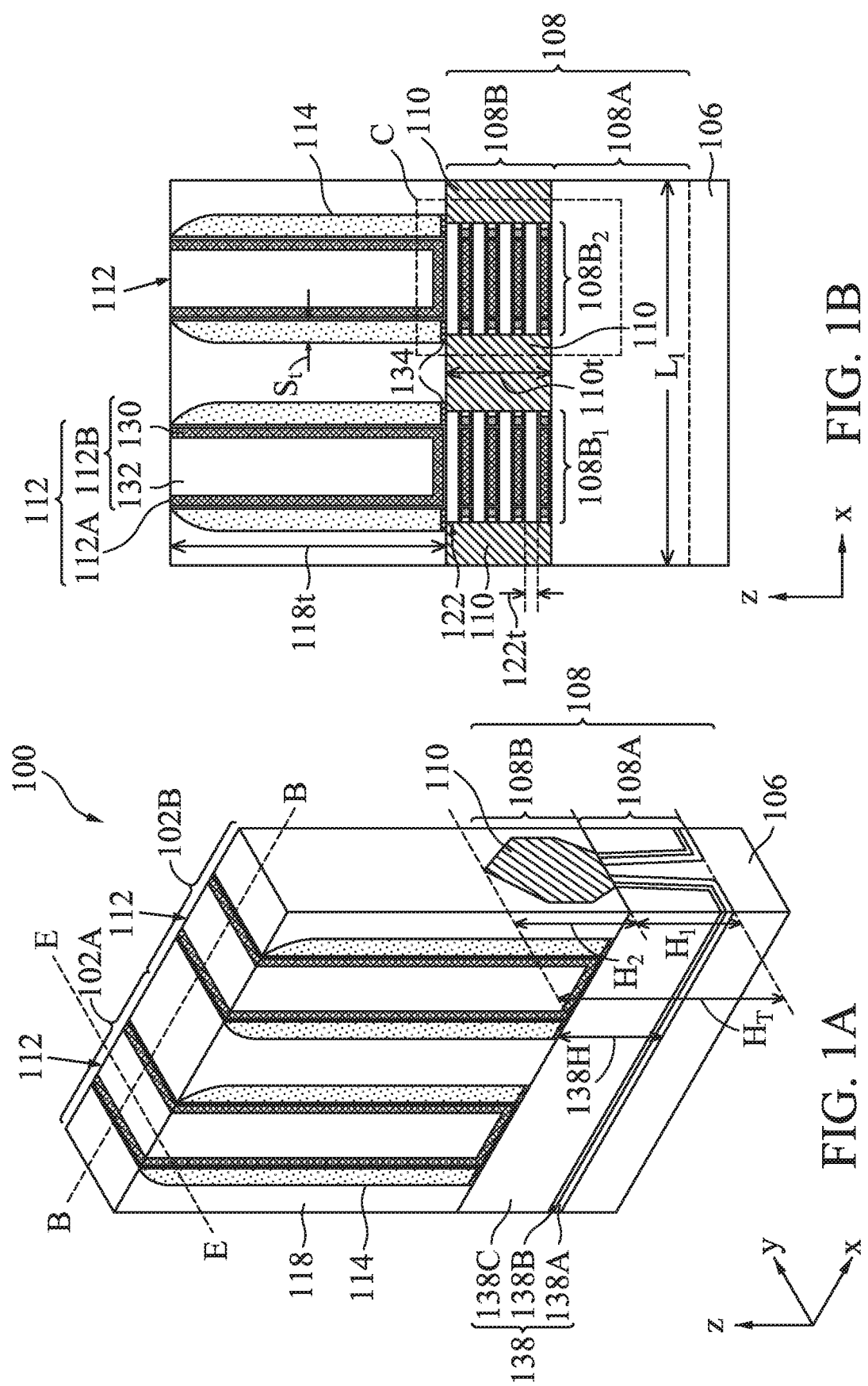

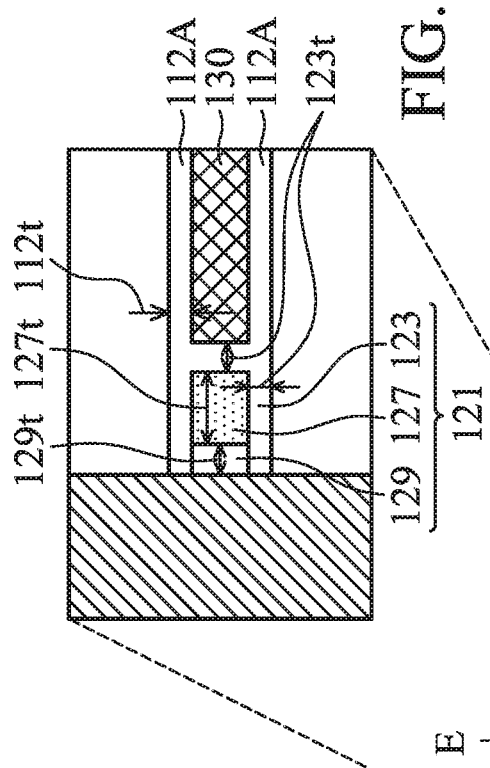
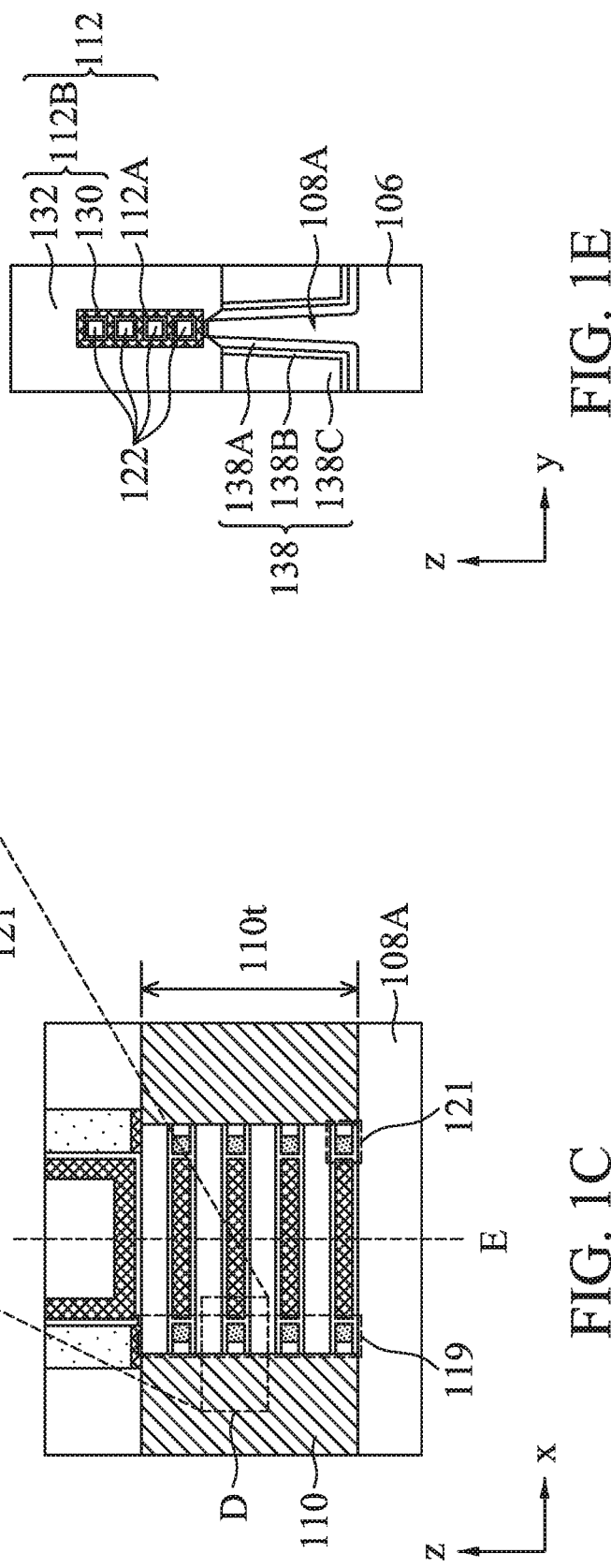
FIG. 1C
FIG. 1D
FIG. 1E

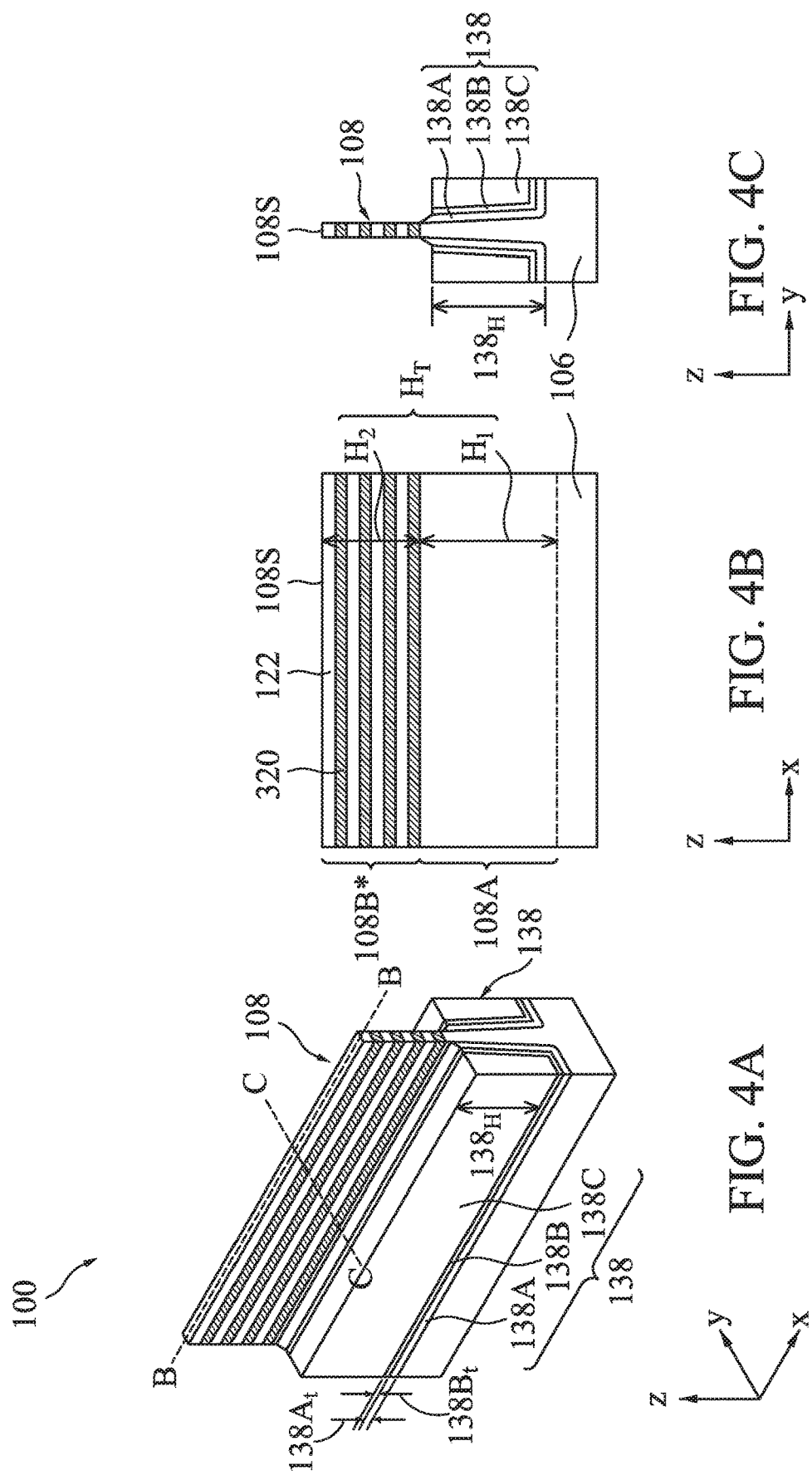

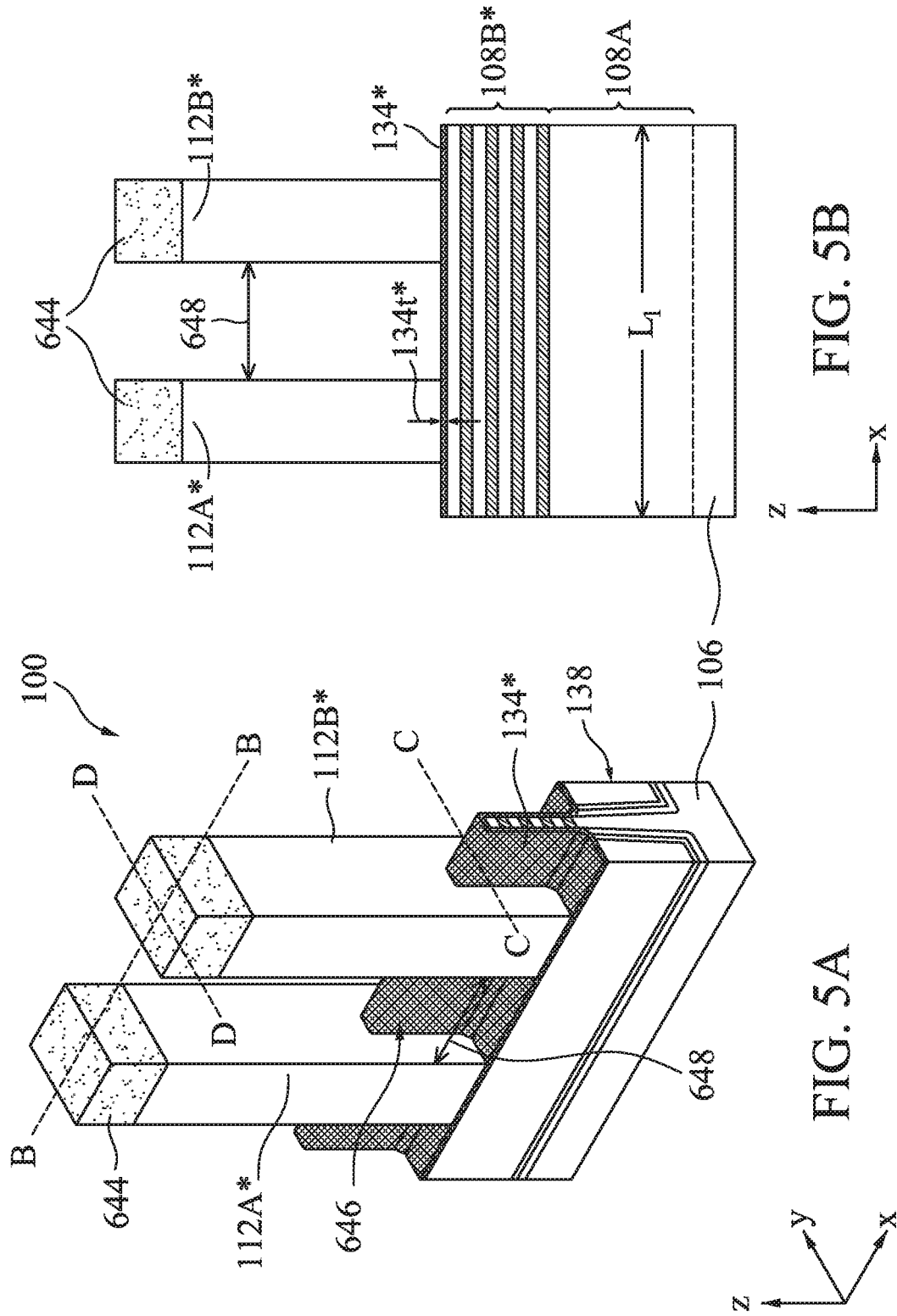

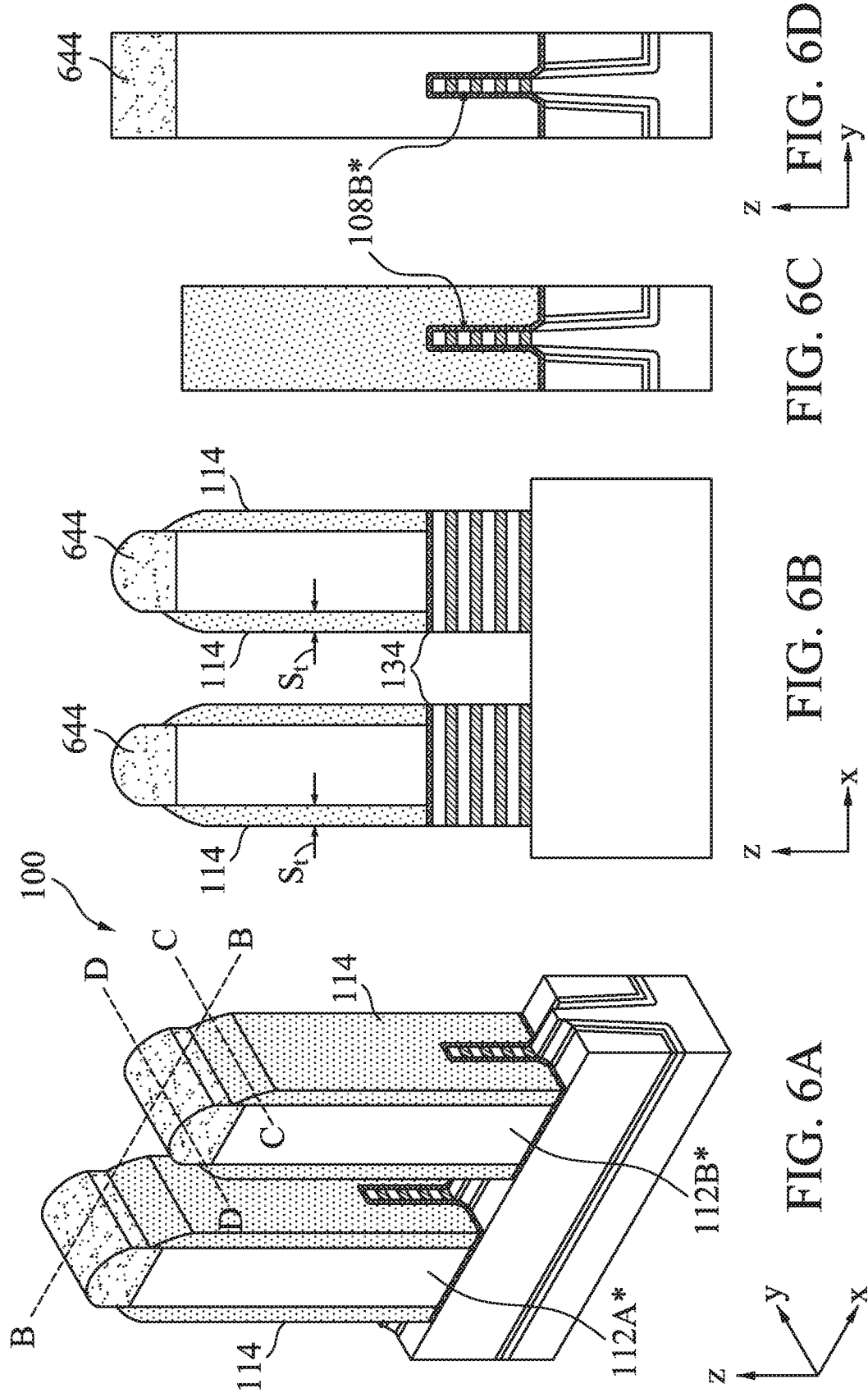

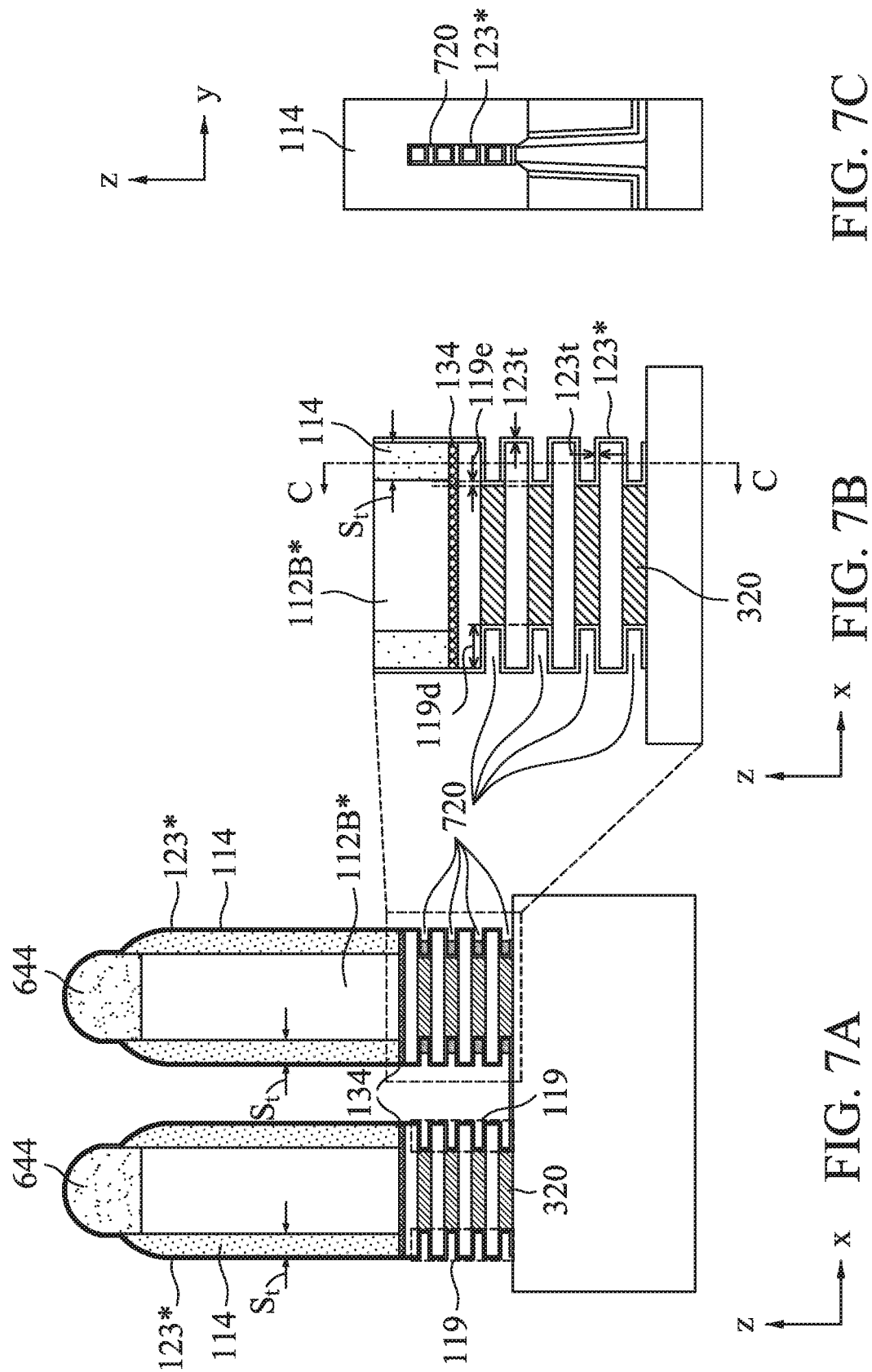

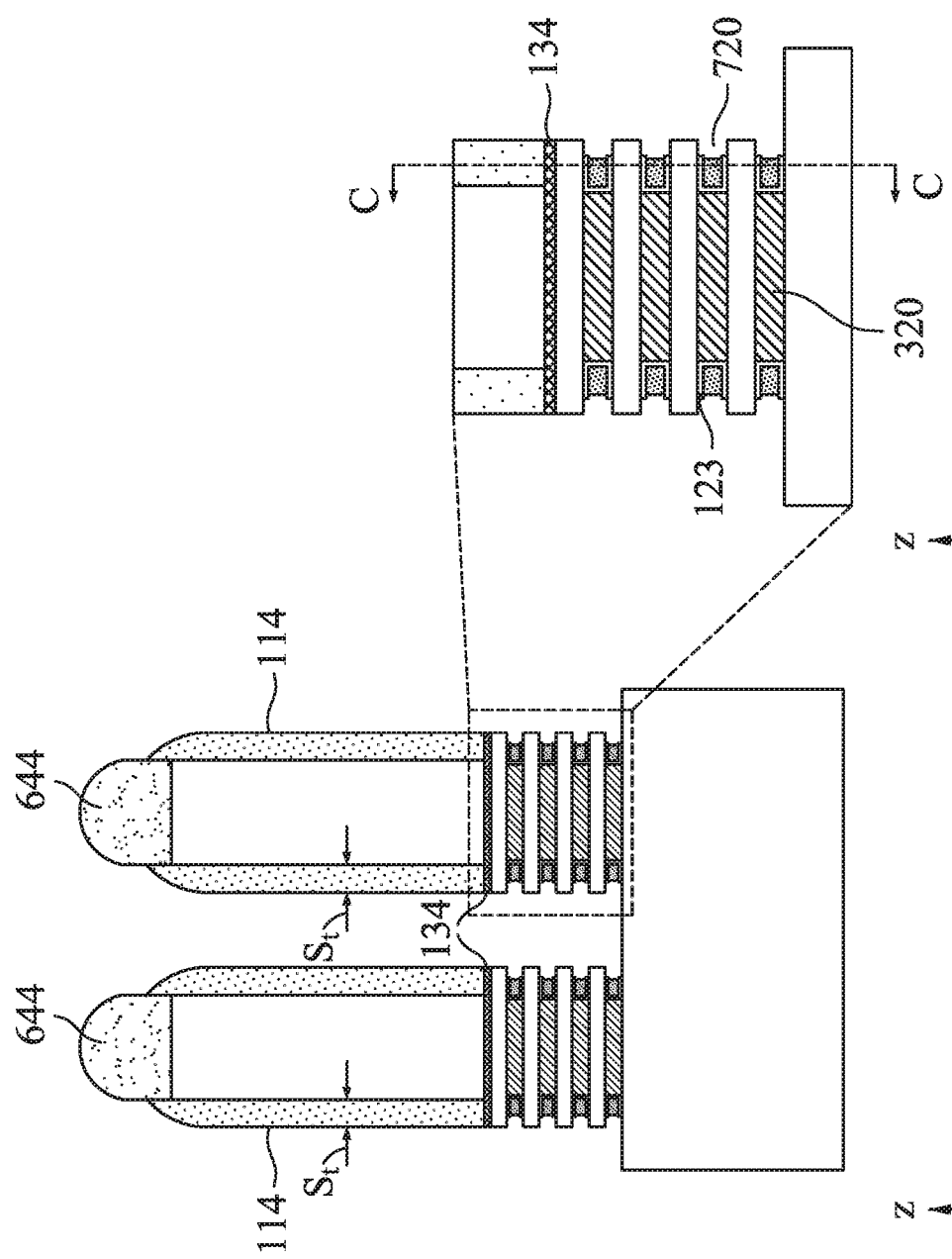

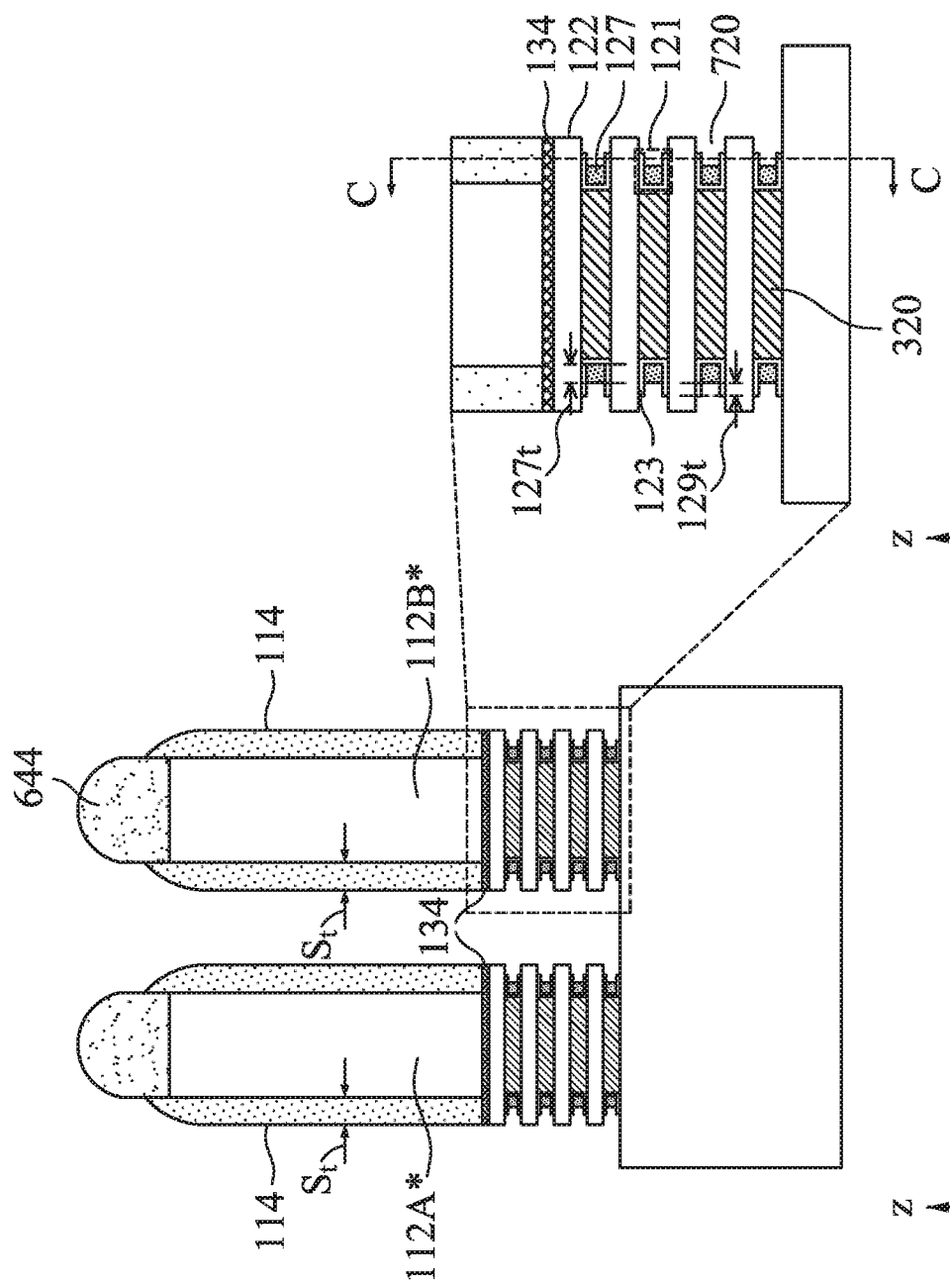

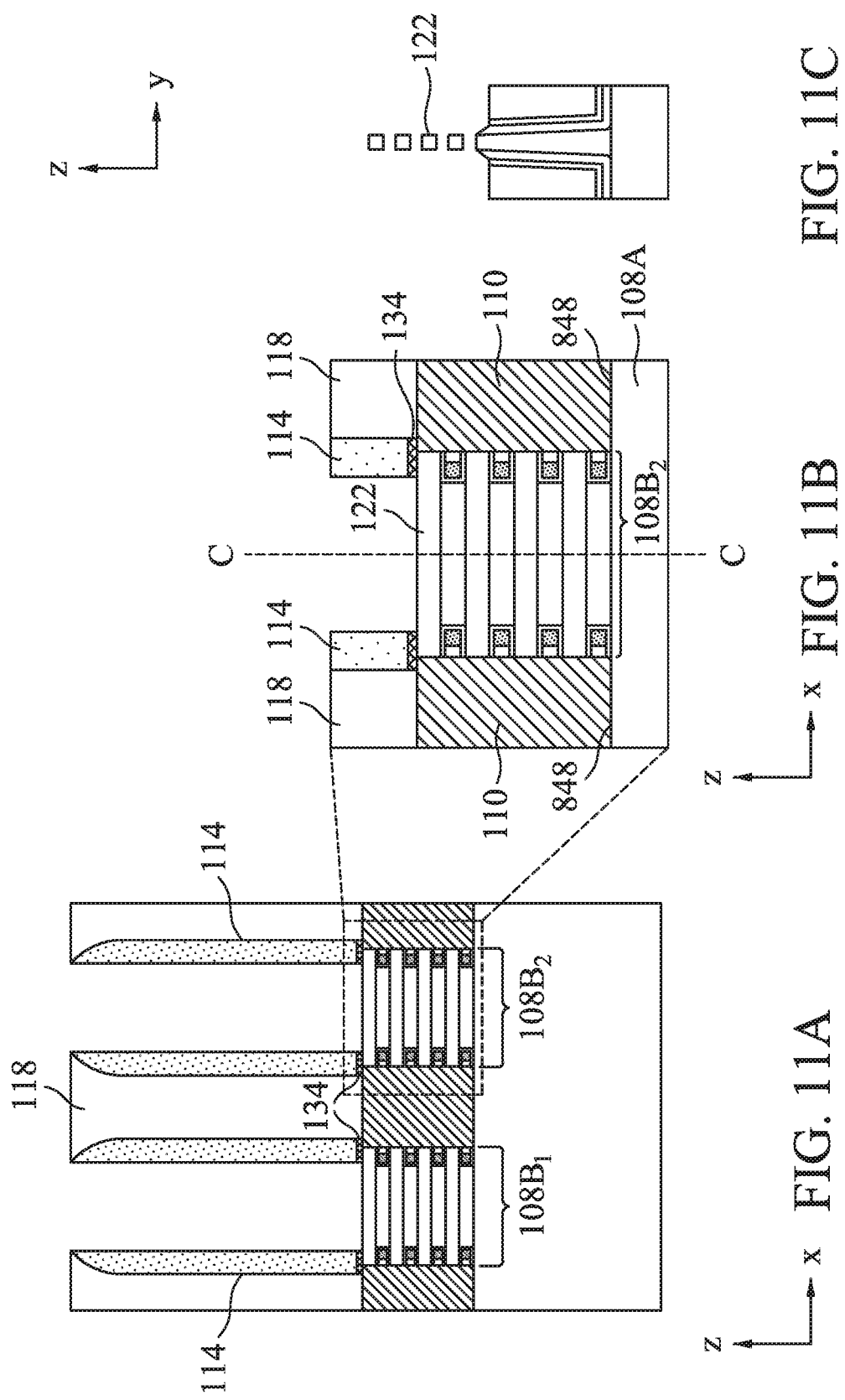

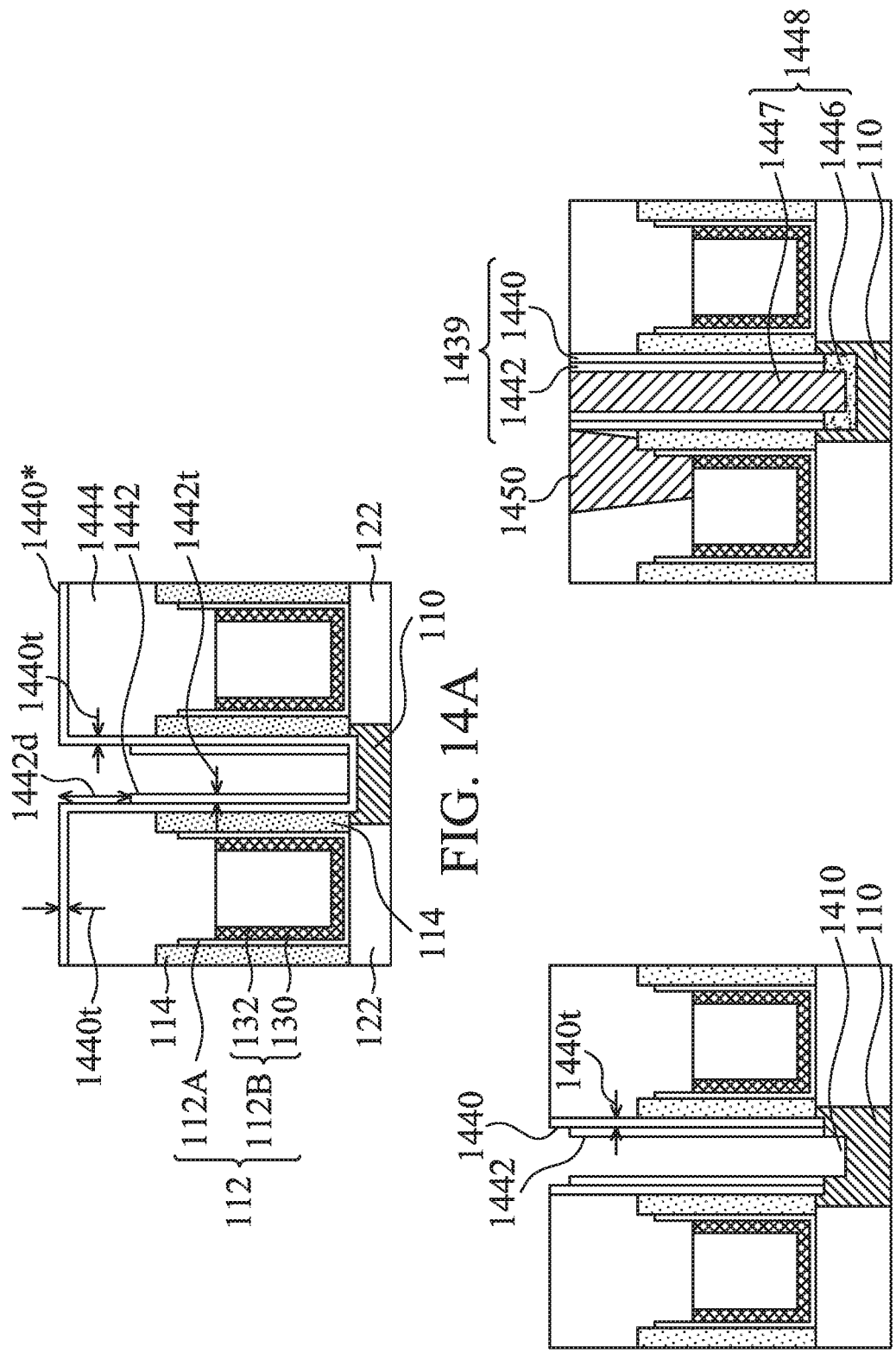

FIELD EFFECT TRANSISTOR WITH NEGATIVE CAPACITANCE DIELETRIC STRUCTURES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased power consumption and parasitic capacitance in semiconductor devices.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1A and 1B-1E illustrate an isometric view and cross-sectional views of a semiconductor device, respectively, in accordance with some embodiments.

FIGS. 3A-6A illustrate isometric views of a semiconductor device with negative capacitance dielectric structures at various stages of its fabrication process, in accordance with some embodiments.

FIGS. 7A-14A, 3B-14B, 3C-14C, and 5D-6D illustrate cross-sectional views of a semiconductor device with negative capacitance dielectric structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 2:
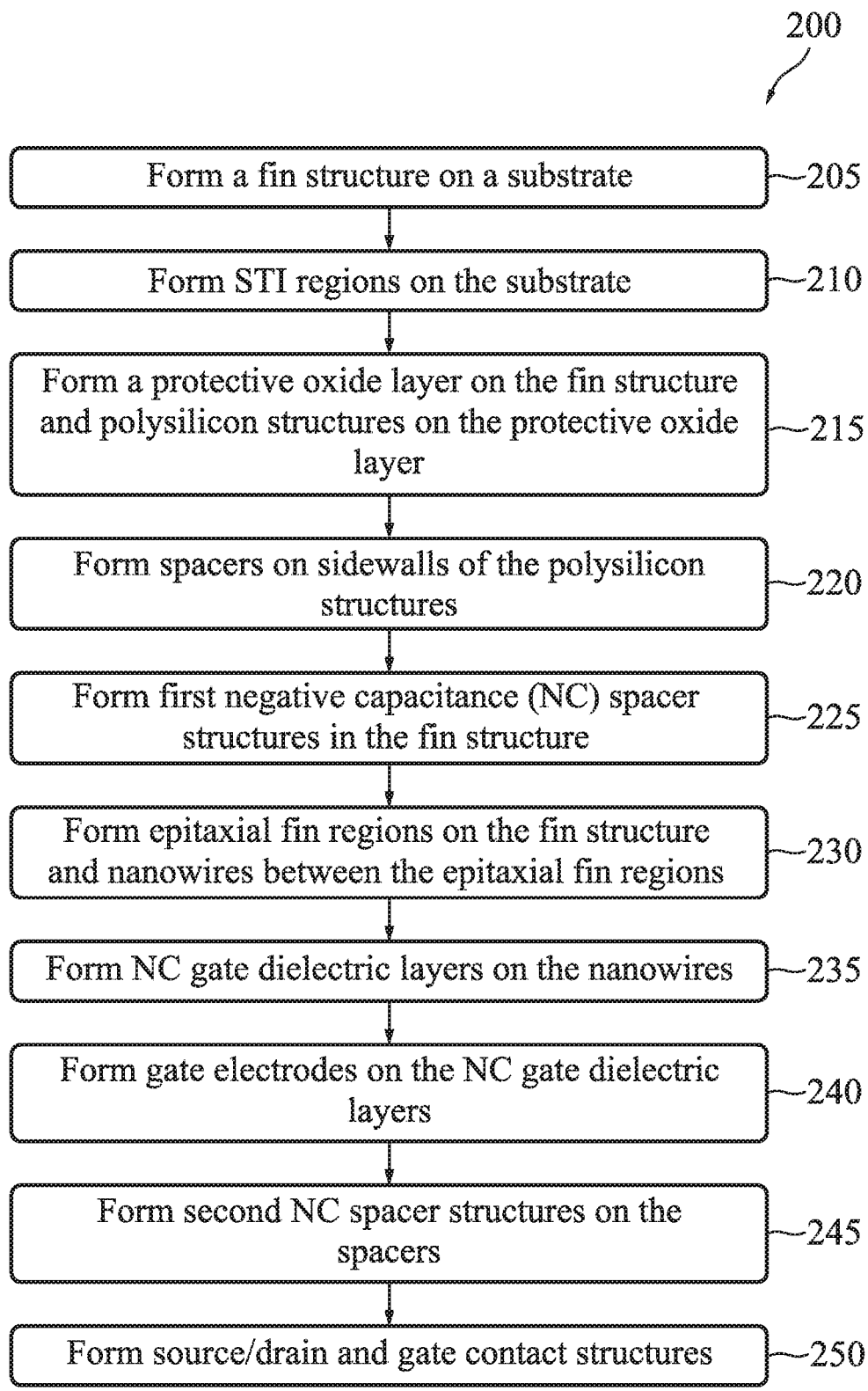
FIG. 2 is a flow diagram of a method for fabricating a semiconductor device with negative capacitance dielectric structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "high-k" refers to a high dielectric constant. In the field of semiconductor device structures and manufacturing processes, high-k refers to a dielectric constant that is greater than the dielectric constant of SiO2 (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value).

The fin structures discloses herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example negative capacitance (NC) dielectric structures in field effective transistor (FET) devices (e.g., gate-all-around (GAA) FETs, finFETs, GAA finFETs, or planar FETs) in a semiconductor device and/or in an integrated circuit (IC) and example methods for fabricating the same.

Negative capacitance (NC) can be defined as a decrease in voltage across a capacitor with an increase in charge on the capacitor. Negative capacitance can be found in dielectric and/or ferroelectric materials. The NC of dielectric and/or ferroelectric materials can be applied to devices for improved device performance.

The example methods in the present disclosure can form FET devices having gate structures with NC material based gate dielectric layers (also referred to as NC gate dielectric layers). In some embodiments, the NC materials can include a dielectric material with ferroelectric properties, a dielectric material in orthorhombic phase (e.g., hafnium oxide ($HfO_2$) in orthorhombic phase), and/or a dielectric material (e.g., $HfO_2$) doped with one or more metals, such as aluminum (Al), calcium (Ca), cerium (Ce), dysprosium (Dy), Erbium (Er), gadolinium (Gd), germanium (Ge), lanthanum (La), scandium (Sc), silicon (Si), strontium (Sr), stannum (Sn), yttrium (Y), zirconium (Zr), or a combination thereof. The NC gate dielectric layers can reduce subthreshold swing (SS) through internal voltage amplification mechanism and increase channel on-current to off-current (Ion/Ioff) ratio of the devices. The SS can represent the current on-off switching characteristics of a device, and can be a factor in determining the switching speed of the device. The reduction of SS in the FET devices can achieve faster device operation along with lower switching energy, and can effectively scale down the supply voltage and significantly lower the power consumption in these FET devices.

In some embodiments, the example methods can form first and second NC spacer structures between gate structures and source/drain (S/D) regions of the FET devices to reduce parasitic capacitances between them. The parasitic capacitance can arise from an electrical coupling between one signal line and another signal line or a signal line and the substrates of the FET devices and can negatively impact device performance at high frequencies. In some embodiments, the first NC spacer structure can be disposed between an epitaxial S/D region and a portion of the gate structure of a GAA finFET and can include an NC material based dielectric layer, a non-NC material based dielectric layer, and an air-gap. In some embodiments, the second NC spacer structure can be disposed between a S/D contact structure and the gate structure of the GAA finFET and can include an NC material based dielectric layer and a nitride layer.

A semiconductor device 100 having finFETs 102A-102B is described with reference to FIGS. 1A-1E, according to some embodiments. FIG. 1A illustrates an isometric view of semiconductor device 100, according to some embodiments, FIG. 1B illustrates a cross-sectional view along line B-B of semiconductor device 100 of FIG. 1A, FIG. 1C illustrates a zoomed-in area C of the cross-sectional view of FIG. 1B, FIG. 1D illustrates a zoomed-in area D of the cross-sectional view of FIG. 1C, and FIG. 1E illustrates a cross-sectional view along line E-E of semiconductor device 100 in FIG. 1A, according to some embodiments. In some embodiments, finFETs 102A-102B can be both p-type finFETs (PFETs) or n-type finFETs (NFETs) or one of each conductivity type finFETs. Though two finFETs are shown in FIGS. 1A-1B, semiconductor device 100 can have any number of finFETs. The discussion of elements of finFET 102A-102B with the same annotations applies to each other, unless mentioned otherwise. The isometric and cross-sectional views of semiconductor device 100 are shown for illustration purposes and may not be drawn to scale.

Referring to FIGS. 1A-1B, finFETs 102A-102B can be formed on a substrate 106. Substrate 106 can be a semiconductor material such as, but not limited to, silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Semiconductor device 100 can further include a fin structure 108 extending along an X-axis and through finFETs 102A-102B. Fin structure 108 can include a fin base portion 108A and a fin top portion 108B disposed on fin base portion 108A. In some embodiments, fin base portion 108A can include material similar to substrate 106. Fin base portion 108A can be formed from a photolithographic patterning and an etching of substrate 106. In some embodiments, fin top portion 108B can include stacked fin portions $108B_1$ and $108B_2$ and epitaxial regions 110. Each of stacked fin portions $108B_1$ and $108B_2$ can include a stack of semiconductor layers 122, which can be in the form of nanowires. Each semiconductor layer 122 can form a channel region underlying gate structures 112 of finFETs 102A-102B.

In some embodiments, semiconductor layers 122 can include semiconductor materials similar to or different from substrate 106. In some embodiments, each of semiconductor layer 122 can include silicon germanium (SiGe) with Ge in a range from about 25 atomic percent to about 50 atomic percent with any remaining atomic percent being Si or can include Si without any substantial amount of Ge.

The semiconductor materials of semiconductor layers 122 can be undoped or can be in-situ doped during their epitaxial growth process using: (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. Semiconductor layers 122 can have respective vertical dimensions $122t$ (e.g., thicknesses) along a Z-axis, each ranging from about 6 nm to about 10 nm. Other dimensions and materials for semiconductor layers 122 are within the scope and spirit of this disclosure. Though four layers of semiconductor layers 122 are shown in FIGS. 1A-1B, semiconductor device 100 can have any number of semiconductor layers 122.

Referring to FIGS. 1A-1B, epitaxial fin regions 110 can be grown on regions of base fin portion 108A that do not underlie gate structures 112. In some embodiments, epitaxial fin regions 110 can have any geometric shape, for example, polygonal or circular. Epitaxial fin regions 110 can include an epitaxially-grown semiconductor material. In some embodiments, the epitaxially grown semiconductor material is the same material as the material of substrate 106. In some embodiments, the epitaxially-grown semiconductor material includes a different material from the material of substrate 106. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide.

Referring to FIG. 1C, in some embodiments, epitaxial fin regions 110 can each have a height 110t. In some embodiments, epitaxial fin height 110t can be equal to or different from vertical dimension $H_2$ of fin top portion 108B. In some embodiments, epitaxial fin height 110t can range from about 10 nm to about 100 nm. Other dimensions for epitaxial fin regions 110 are within the scope and spirit of this disclosure.

In some embodiments, epitaxial fin regions 110 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. Such repeated deposition/partial etch process is also called a cyclic deposition-etch (CDE) process.

Epitaxial fin regions 110 can be p-type or n-type for PFETs 102A-102B or NFETs 102A-102B, respectively. In some embodiments, epitaxial fin regions 110 of finFET 102A and finFET 102B can be the same or opposite doping type with respect to each other. P-type epitaxial fin regions 110 can include SiGe and can be in-situ doped during an epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type epitaxial fin regions 110 can include Si and may be in-situ doped during an epitaxial growth process using n-type dopants, such as phosphorus or arsenic. For n-type in-situ doping, n-type doping precursors such as, but not limited to, phosphine ($PH_3$), arsine ($AsH_3$), and/or other n-type doping precursor can be used.

Referring to FIG. 1B, epitaxial fin regions 110 can form source/drain (S/D) regions of finFETs 102A-102B. Each of the channel regions in semiconductor layers 122 of stacked fin portions $108B_1$ and $108B_2$ can be interposed between a pair of S/D regions. Though finFETs 102A-102B are shown to have fin structure 108 with stacked fin portions $108B_1$ and $108B_2$ on fin base portion 108A, other fin structures (e.g., a single layered fin structure etched from or epitaxially grown on substrate 106) of finFETs 102A and/or 102B are within the scope and spirit of this disclosure.

In some embodiments, fin base portion 108A and fin top portion 108B can have respective vertical dimensions $H_1$ and $H_2$ (e.g., heights) along a Z-axis, each ranging from about 40 nm to about 60 nm. Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm. In some embodiments, fin structure 108 can have a horizontal dimension $L_1$ (e.g., length) along an X-axis ranging from about 100 nm to about 1 μm. Horizontal dimension $L_1$ of fin structure 108 can be at least 100 nm to prevent the relaxation of strain in fin structure 108, and consequently, prevent the relaxation of strain in channel regions formed in semiconductor layers 122 under gate structures 112. Other dimensions and materials for fin structure 108 are within the scope and spirit of this disclosure.

In some embodiments, finFETs 102A-102B can further include gate structures 112 and spacers 114.

Referring to FIGS. 1A-1E, gate structures 112 can be multi-layered structures and can be wrapped around stacked fin portions $108B_1$ and $108B_2$. In some embodiments, each of semiconductor layers 122 of stacked fin portions $108B_1$ and $108B_2$ can be wrapped around by one of gate structures 112 or one or more layers of one of gate structures 112 for which gate structures 112 can be also referred to as "gate-all-around (GAA) structures" or "horizontal gate-all-around structures" and finFETs 102A-102B can be also referred to as "GAA FETs" or "GAA finFETs."

Each gate structure 112 can include a gate dielectric layer 112A having a negative capacitance (NC) material (also referred to as NC gate dielectric layer 112A) disposed on semiconductor layers 122 and a gate electrode 112B disposed on NC gate dielectric layer 112A. As shown in FIG. 1E, NC gate dielectric layer 112A can be wrapped around each semiconductor layer 122, and thus, electrically isolate semiconductor layers 122 from each other and from conductive gate electrode 112B to prevent shorting between gate structures 112 and S/D regions during operation of finFETs 102A-102B.

Referring to FIG. 1D, each NC gate dielectric layer 112A can have a thickness 112t ranging from about 2 nm to about 3 nm. In some embodiments, NC gate dielectric layer 112A can include a dielectric material with ferroelectric properties, such as hafnium oxide ($HfO_2$), hafnium aluminum oxide (HfAlO), hafnium silicate (HfSiO), hafnium zirconium oxide (HfZrO), or the like. NC gate dielectric layer 112A can be formed using sputtering, PVD, CVD, or other suitable processes. Though some NC materials of NC gate dielectric layer 112A includes the same atomic elements as high-k dielectric materials, NC gate dielectric layer 112A can have different properties than high-k dielectric materials. For example, the NC material of NC gate dielectric layer 112A can have a resistivity lower than the respective high-k dielectric material that has the same type of atomic elements.

In addition, the negative capacitance property of the dielectric material of NC gate dielectric layer 112A can be affected by various factors including, and not limited to, the atomic elements of the dielectric material, the atomic percentage of the atomic elements, and/or the phase of the crystal structure of the dielectric material. The phase can also be affected by the deposition process conditions and post-treatment conditions for forming NC gate dielectric layer 112A. Thus, a dielectric material having the same atomic elements and/or the same atomic percentages of the atomic elements as the dielectric material of NC gate dielectric layer 112A may not exhibit negative capacitance property, and thus, many not be considered as an NC material.

In some embodiments, NC gate dielectric layer 112A can include a high-k or low-k dielectric material in orthorhombic phase (e.g., high-k $HfO_2$ in orthorhombic phase) and/or a high-k or low-k dielectric material subjected to one or more treatment method, such as doping, stressing, and/or thermal annealing. In some embodiments, NC gate dielectric layer 112A can include stable orthorhombic phase NC dielectric material formed by doping and/or thermal annealing $HfO_2$ with metals, such as aluminum (Al), calcium (Ca), cerium (Ce), dysprosium (Dy), Erbium (Er), gadolinium (Gd), germanium (Ge), lanthanum (La), scandium (Sc), silicon (Si), strontium (Sr), stannum (Sn), yttrium (Y), zirconium (Zr), and/or a combination thereof. Other materials and formation methods for NC material of NC gate dielectric layer 112A are within the scope and spirit of this disclosure.

In some embodiments, NC gate dielectric layer 112A can include NC dielectric material formed by doping $HfO_2$ with (i) about 2 atomic percent to about 15 atomic percent of Al; (ii) about 2 atomic percent to about 26 atomic percent of Ge; (iii) about 2 atomic percent to about 25 atomic percent of La; (iv) about 2 atomic percent to about 24 atomic percent of Si; (v) about 2 atomic percent to about 30 atomic percent of Sr; (vi) about 1 atomic percent to about 40 atomic percent of Y; and/or (vii) about 3 atomic percent to about 60 atomic percent of Zr. The thermal annealing temperature can range from about 700° C. to about 1000° C. The doping of $HfO_2$ can be followed by thermal annealing to form the NC dielectric material for NC gate dielectric layer 112A. In some embodiments, the thermal annealing temperature can range from about 700° C. to about 900° C. (e.g., about 850° C.). Other materials and formation methods for NC material of NC gate dielectric layer 112A are within the scope and spirit of this disclosure.

In some embodiments, NC gate dielectric layer 112A can include a single layer or a stack of insulating material layers in addition to the layer of NC material. In some embodiments, NC gate dielectric layer 112A can include (i) a layer of silicon oxide, silicon nitride, and/or silicon oxynitride formed by CVD, atomic layer deposition (ALD), physical vapor deposition (PVD), e-beam evaporation, or other suitable processes, (ii) a high-k dielectric material, such as $HfO_2$, titanium oxide ($TiO_2$), tantalum oxide ($Ta_2O_3$), $HfSiO_4$, zirconium oxide ($ZrO_2$), zirconium silicate ($ZrSiO_2$), (iii) a high-k dielectric material having oxides of lithium (Li), beryllium (Be), magnesium (Mg), Ca, Sr, Sc, Y, Zr, Al, La, Ce, praseodymium (Pr), neodymium (Nd), samarium (Sm), europium (Eu), Gd, terbium (Tb), Dy, holmnium (Ho), Er, thulium (Tin), ytterbium (Yb), or lutetium (Lu), or (iv) a combination thereof. High-k dielectric layers can be formed by ALD and/or other suitable methods. Other materials and formation methods for NC material of NC gate dielectric layer 112A are within the scope and spirit of this disclosure.

NC gate dielectric layers 112A of finFETs 102A-102B can reduce subthreshold swing through internal voltage amplification mechanism, and thus scale down the supply voltage and lower power dissipation of finFETs 102A-102B. The negative capacitance effect of gate dielectric layers 112A can overcome the lower limit of voltage operation and achieve faster operation along with lower switching energy for finFETs 102A-102B.

In some embodiments, each gate electrode 112B can include a gate barrier layer (not shown), a gate work function layer 130, and a gate metal fill layer 132. As shown in FIG. 1E, each semiconductor layers 122 of stacked fin portions $108B_1$ and $108B_2$ can be wrapped around by one of gate barrier layers and one of gate work function layers 130. Depending on the spaces between adjacent semiconductor layers 122 and the thicknesses of the layers of gate structures 112, semiconductor layers 122 can be wrapped around by one or more layers of gate electrodes 112B filling the spaces between adjacent semiconductor layers 122. Though FIG. 1E shows gate metal fill layers 132 partially wrapped around semiconductor layers 122, gate metal fill layers 132 can also wrap around semiconductor layers 122 to fill the spaces between adjacent semiconductor layers 122 (not shown), according to some embodiments.

In embodiments, gate barrier layers can serve as nucleation layers for subsequent formation of gate work function layers 130 and/or can help to prevent substantial diffusion of metals (e.g., Al) from gate work function layers 130 to underlying layers (e.g., NC gate dielectric layer 112A or oxide layers). Each gate barrier layer can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layers can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules. In some embodiments, each gate barrier layer can have a thickness ranging from about 1 nm to about 10 nm. Other materials, formation methods and thicknesses for gate barrier layers are within the scope and spirit of this disclosure.

Each gate work function layer 130 can include a single metal layer or a stack of metal layers. The stack of metal layers can include metals having work function values equal to or different from each other. In some embodiments, each gate work function layer 130 can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, each gate work function layer 130 can include Al-doped metal, such as Al-doped Ti, Al-doped TiN, Al-doped Ta, or Al-doped TaN. Gate work function layers 130 can be formed using a suitable process such as ALD, CVD, PVD, plating, or combinations thereof. In some embodiments, each gate work function layer 130 can have a thickness ranging from about 2 nm to about 15 nm. Other materials, formation methods and thicknesses for gate work function layers 130 are within the scope and spirit of this disclosure.

Each gate metal fill layer 132 can include a single metal layer or a stack of metal layers. The stack of metal layers can include metals different from each other. In some embodiments, each gate metal fill layer 132 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Gate metal fill layers 132 can be formed by ALD, PVD, CVD, or other suitable deposition processes. Other materials and formation methods for gate metal fill layers 132 are within the scope and spirit of this disclosure. Though gate structures 112 of finFETs 102A-102B are shown to be similar, finFETs 102A-102B can have gate structures with materials and/or electrical properties (e.g., threshold voltage, work function value) different from each other. Also, though gate structures 112 are shown to have horizontal GAA structures, other gate structures (e.g., vertical GAA structures or gate structures without GAA structures) are within the scope and spirit of this disclosure.

Referring to FIGS. 1A-1B, spacers 114 (also referred to as non-NC material based dielectric layers 114) can form sidewalls of gate structures 112 and be in physical contact with portions of NC gate dielectric layers 112A, according to some embodiments. Spacers 114 can include insulating material, such as silicon oxide, silicon nitride, a low-k material, or a combination thereof. Spacer 114 can include a single layer or a stack of insulating layers. Spacers 114 can have a low-k material with a dielectric constant less than about 3.9 (e.g., about 3.5, about 3.0, or about 2.8). In some embodiments, spacers 114 can include a material composed of silicon, oxygen, carbon, and/or nitrogen. The concentrations of silicon, oxygen, carbon, and nitrogen in the material for spacers 114 can depend on the desired dielectric constant for spacers 114. Varying concentrations of silicon, oxygen, carbon, and nitrogen in the material can vary the desired dielectric constant of spacers 114. In some embodiments, each spacer 114 can include a layer of silicon oxycarbonitride (SiOCN), a layer of silicon carbon nitride (SiCN), a layer of silicon oxide carbide (SiOC), or a combination thereof. In some embodiments, each spacer 114 can include a stack of a SiOCN layer disposed on a SiOC layer, which is disposed on a SiOCN layer.

In some embodiments, the layer of SiOCN can include silicon concentration ranging from about 25 atomic percent to about 35 atomic percent, oxygen concentration ranging from about 30 atomic percent to about 50 atomic percent, carbon concentration ranging from about 1 atomic percent to about 15 atomic percent, and nitrogen concentration ranging from about 8 atomic percent to about 25 atomic percent.

In some embodiments, the layer of SiCN can include silicon concentration ranging from about 35 atomic percent to about 40 atomic percent, carbon concentration ranging from about 5 atomic percent to about 10 atomic percent, and nitrogen concentration ranging from about 40 atomic percent to about 50 atomic percent.

In some embodiments, each spacer 114 can have a thickness $S_t$ ranging from about 5 nm to about 12 nm. Other materials and dimensions for spacers 114 are within the scope and spirit of this disclosure.

Referring to FIGS. 1C-1D, inner spacer structures 121 (also referred to as first NC spacer structures 121) can be formed at fin regions 119 between epitaxial fin regions 110 and portions of gate structures 112, which are between adjacent semiconductor layers 122, according to some embodiments. Each inner spacer structure 121 can include an NC material based dielectric layer 123 (also referred to as NC dielectric layer 123), a non-NC material based dielectric layer 127 (also referred to as non-NC dielectric layer 127), and/or an air gap 129. Non-NC dielectric layer 127 and air gap 129 can be enclosed by NC dielectric layer 123 and epitaxial fin region 110. NC dielectric layer 123 can have a NC material similar to NC gate dielectric layer 112A, or a different NC material from the NC materials described above.

Non-NC dielectric layer 127 can have a low-k material with a dielectric constant less than about 3.9 (e.g., about 3.5, about 3.0, or about 2.8) or a high-k material with a dielectric constant ranging from about 4 to about 7. In some embodiments, NC dielectric layers 123 and non-NC dielectric layers 127 can have dielectric constant equal to or different from each other. Non-NC dielectric layer 127 can include a single layer or a stack of dielectric layers. In some embodiments, non-NC dielectric layers 127 can include a non-NC dielectric material composed of silicon, oxygen, carbon, and/or nitrogen. The concentrations of silicon, oxygen, carbon, and nitrogen in the non-NC dielectric material for non-NC dielectric layers 127 can depend on the desired dielectric constant for non-NC dielectric layers 127. Varying concentrations of silicon, oxygen, carbon, and nitrogen in the non-NC dielectric material can vary the desired dielectric constant of non-NC dielectric layers 127. The non-NC dielectric material can include SiOC, SiCN, SiOCN, SiN, silicon oxide ($SiO_x$), silicon oxynitride ($SiO_yN$) and/or a combination thereof, deposited by ALD, flowable CVD (FCVD), or other suitable methods. In some embodiments, non-NC dielectric layer 127 can include SiN formed at a temperature in a range from about 450° C. to about 570° C. using ALD.

In some embodiments, the non-NC dielectric material can include a layer of SiOCN, which can have a silicon concentration higher than carbon concentration. For example, the silicon concentration can be about 2 to 10 times higher than the carbon concentration and the silicon concentration can range from about 25 atomic percent to about 35 atomic percent and the carbon concentration can range from about 5 atomic percent to about 15 atomic percent. In some embodiments, the non-NC dielectric material can include a layer of SiOC, which can have a silicon concentration higher than carbon concentration. For example, the silicon concentration can be about 2 to 5 times higher than the carbon concentration and the silicon concentration can range from about 25 atomic percent to about 30 atomic percent and the carbon concentration can range from about 8 atomic percent to about 10 atomic percent.

In some embodiments, the non-NC dielectric material can include a layer of SiCN which can have a silicon concentration higher than carbon concentration. For example, the silicon concentration can be about 15 to 20 times higher than the carbon concentration and the silicon concentration can range from about 30 atomic percent to about 40 atomic percent and the carbon concentration can range from about 1 atomic percent to about 4 atomic percent. In some embodiments, the non-NC dielectric material can include an oxygen concentration at least about 1.2 to 2 times higher than other elements in the non-NC dielectric material.

Air gaps 129 can be filled with air, and the dielectric constant can be about 1. In some embodiments, inner spacer structures 121 may not have air gaps 129. In some embodiments, NC dielectric layer 123 can have a dimension 123t (e.g., thickness) along an X-axis or a Z-axis ranging from about 2 nm to about 3 nm, non-NC dielectric layer 127 can have a dimension 127t (e.g., thickness) along an X-axis ranging from about 3 nm to about 6 nm, and air gap 129 can have a dimension 129t (e.g., thickness) along an X-axis ranging from about 2 nm to about 3 nm. The dielectric constant of each inner spacer structure 121 can be tuned by varying thicknesses 123t, 127t, and/or 129t. In some embodiments, a ratio between thicknesses 127t and 129t can range from about 1 to about 4 and a ratio between thicknesses 127t and 123t can range from about 1 to about 4. Other materials and dimensions for inner spacer structures 121 are within the scope and spirit of this disclosure.

Non-NC dielectric layer 127 and air gap 129 can reduce the parasitic capacitance of finFETs 102-102B. NC dielectric layer 123 can further reduce the parasitic capacitance with higher dielectric constant and without increasing current leakage.

Referring to FIGS. 1A-1E, semiconductor device 100 can further include an etch stop layer (ESL) (not shown), an interlayer dielectric (ILD) layer 118, and shallow trench isolation (STI) regions 138. ESL can be configured to protect gate structures 112 and/or epitaxial fin regions 110. This protection can be provided, for example, during formation of ILD layer 118 and/or S/D contact structures (not shown in FIGS. 1A-1E; shown in FIG. 14C). ESL can be disposed on sidewalls of spacers 114. In some embodiments, ESL can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL can have a thickness ranging from about 3 nm to about 30 nm. Other materials, formation methods, and thicknesses for ESL are within the scope and spirit of this disclosure.

ILD layer 118 can be disposed on ESL and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material is silicon oxide. In some embodiments, ILD layer 118 can have a thickness 118$t$ in a range from about 50 nm to about 200 nm. Other materials, thicknesses, and formation methods for ILD layer 118 are within the scope and spirit of this disclosure.

STI regions 138 can be configured to provide electrical isolation between finFETs 102A-102B with fin structure 108 and neighboring finFETs with different fin structures (not shown) on substrate 106 and/or neighboring active and passive elements (not shown) integrated with or deposited on substrate 106. In some embodiments, STI regions 138 can include first and second protective liners 138A-138B and an insulating layer 138C disposed on second protective liner 138B. In some embodiments, insulating layer 138C can include silicon oxide, silicon nitride, silicon oxynitride, fluorine-doped silicate glass (FSG), a low-k dielectric material, and/or other suitable insulating materials. In some embodiments, STI regions 138 can have a vertical dimension 138$_H$ (e.g., height) along a Z-axis ranging from about 40 nm to about 60 nm. In some embodiments, vertical dimension 138$_H$ can be half of the total height H$_T$ of fin structure 108.

Based on the disclosure herein, it will be recognized that cross-sectional shapes of semiconductor device 100 and its elements (e.g., fin structure 108, gate structures 112, epitaxial fin regions 110, spacers 114, inner spacer structures 121, and/or STI regions 138) are illustrative and are not intended to be limiting.

FIG. 2 is a flow diagram of an example method 200 for fabricating semiconductor device 100, according to some embodiments. For illustrative purposes, the operations illustrated in method 200 will be described with reference to the example fabrication process for fabricating semiconductor device 100 as illustrated in FIGS. 3A-14A, 3B-14B, 3C-14C, and 5D-6D. FIGS. 3A-6A are isometric views of semiconductor device 100 at various stages of its fabrication, according to some embodiments. FIGS. 3B-6B, 3C-6C and 5D-6D are cross-sectional views along lines B-B, C-C, and D-D of respective structures of FIGS. 3A-6A, respectively, according to some embodiments. FIGS. 7A-14A, 14B and 14C are cross-sectional views along an X-axis of semiconductor device 100 at various stages of its fabrication and along line B-B of the structure of FIG. 6A after further processing, according to some embodiments. FIGS. 7B-13B are zoomed-in views of respective structures of FIGS. 7A-13A, according to some embodiments. FIGS. 7C-13C are cross-sectional views along line C-C of respective structures of FIGS. 7A-13A, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-14A, 3B-14B, 3C-14C, and 5D-6D with the same annotations as elements in FIGS. 1A-1E are described above.

Figures 3A, 3B, 3C:
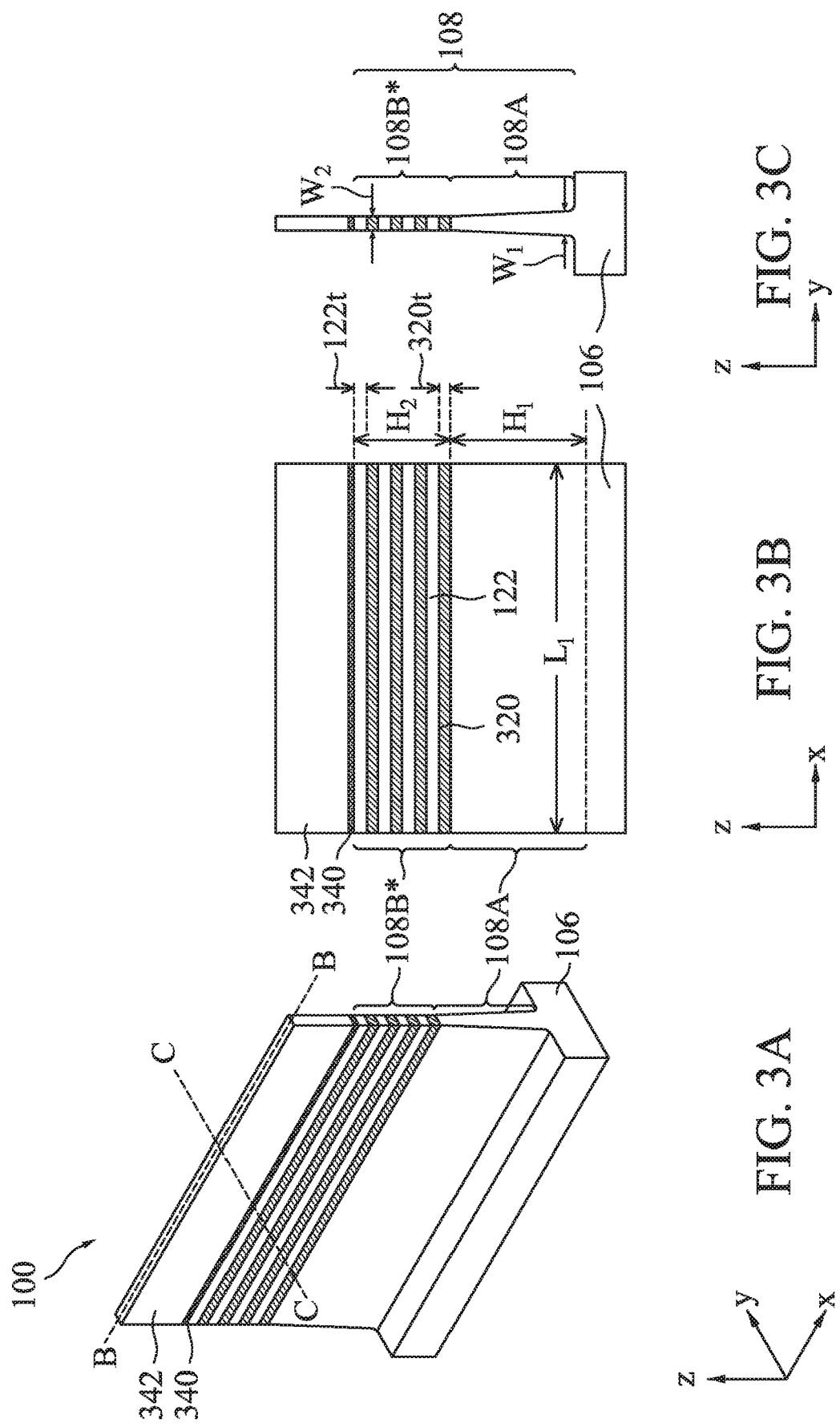
Figure 5D:
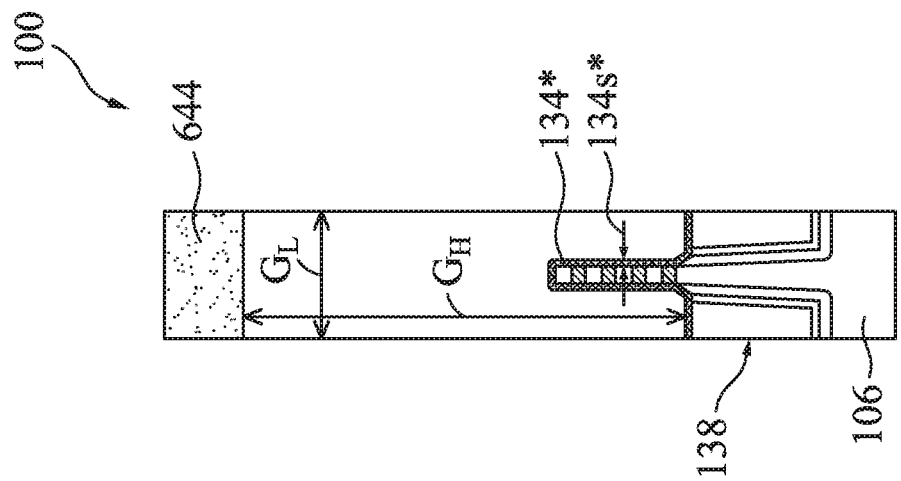
Figure 5C:
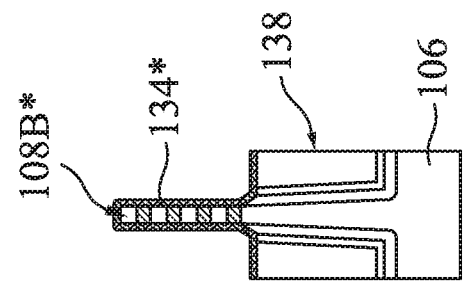

In operation 205, a fin structure is formed on a substrate. For example, fin structure 108 with fin base portion 108A and fin top portion 108B can be formed on substrate 106 as described with reference to FIGS. 3A-3C. The formation of fin structure 108 can include the formation of fin base portion 108A and fin top portion 108B* on substrate 106 as shown in FIGS. 3A-3C. Subsequent processing of fin top portion 108B*, described below, can form fin top portion 108B as described with reference to FIGS. 1A-1E.

Fin top portion 108B* can include first and second semiconductor layers 320 and 122 stacked in an alternating configuration. Each of first and second semiconductor layers 320 and 122 can be epitaxially grown on its underlying layer and can include semiconductor materials different from each other. In some embodiments, first and second semiconductor layers 320 and 122 can include semiconductor materials similar to or different from substrate 106. In some embodiments, first and second semiconductor layers 320 and 122 can include semiconductor materials with oxidation rates and/or etch selectivity different from each other. In some embodiments, each of first and second semiconductor layers 320 and 122 can include silicon germanium (SiGe) with Ge in a range from about 25 atomic percent to about 50 atomic percent with any remaining atomic percent being Si or can include Si without any substantial amount of Ge.

First and/or second semiconductor layers 320 and 122 can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. First and second semiconductor layers 320 and 122 can have respective vertical dimensions 320$t$ and 122$t$ (e.g., thicknesses) along a Z-axis, each ranging from about 6 nm to about 10 nm. Vertical dimensions 320$t$ and 122$t$ can be equal to or different from each other. Though four layers of semiconductor layers 320 and 122 are shown in FIGS. 3A-3C, semiconductor device 100 can have any number of semiconductor layers 320 and 122.

The formation of fin base portion 108A and fin top portion 108B* can include forming a stack of materials for first and second semiconductor layers 320 and 122 on substrate 106 and etching a portion of substrate 106 and the stack of materials through patterned hard mask layers 340 and 342 formed on the stack of materials. In some embodiments, hard mask layer 340 can be a thin film including silicon oxide formed, for example, using a thermal oxidation process. In some embodiments, hard mask layer 342 can be formed of silicon nitride using, for example, low pressure chemical vapor deposition (LPCVD) or plasma enhanced CVD (PECVD). The etching of the stack of materials can include a dry etch, a wet etch process, or a combination thereof. The dry etch process can include using etchants having an oxygen-containing gas, a fluorine-containing gas (e.g., $CF_4$, $SF_6$, $CH_2F_2$, $CHF_3$, and/or $C_2F$), a chlorine-containing gas (e.g., $Cl_2$, $CHCl_3$, $CCl_4$, and/or $BCl_3$), a bromine-containing gas (e.g., Ir and/or $CHBr_3$), an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

In some embodiments, fin base portion 108A and fin top portion 108B* can have respective vertical dimensions $H_1$ and $H_2$ (e.g., heights) along a Z-axis, each ranging from about 40 nm to about 60 nm. Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm. In some embodiments, fin structure 108 can have a horizontal dimension $L_1$ (e.g., length) along an X-axis ranging from about 100 nm to about 1 μm. In some embodiments, fin structure 108 can have a tapered cross-section along a YZ-plane with a horizontal dimension $W_1$ (e.g., width) of fin base portion 108A along a Y-axis being greater than a horizontal dimension $W_2$ of fin top portion 108B along a Y-axis. Horizontal dimension $W_1$ and $W_2$ can range from about 6 nm to about 20 nm.

Referring to FIG. 2, in operation 210, STI regions are formed on the substrate. For example, as shown in FIGS. 4A-4C, STI regions 138 with first and second protective liners 138A-138B and insulating layer 138C can be formed on substrate 106. The formation of STI regions 138 can include (i) depositing a layer of nitride material (not shown) for first protective liners 138A on the structure of FIG. 3A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 4A.

The layers of nitride and oxide materials can be deposited using a suitable process for depositing oxide and nitride materials, such as ALD or CVD. These layers of oxide and nitride materials can prevent oxidation of the sidewalls of fin top portion 108B* during the deposition and annealing of the insulating material for insulating layer 138C.

In some embodiments, the layer of insulating material for insulating layer 138C can include silicon oxide, silicon nitride, silicon oxynitride, fluorine-doped silicate glass (FSG), or a low-k dielectric material. In some embodiments, the layer of insulating material can be deposited using a CVD process, a high-density-plasma (HDP) CVD process, using silane (SiH4) and oxygen ($O_2$) as reacting precursors. In some embodiments, layer of insulating material can be formed using a sub-atmospheric CVD (SACVD) process or high aspect-ratio process (HARP), where process gases can include tetraethoxysilane (TEOS) and/or ozone ($O_3$).

In some embodiments, the layer of insulating material can be formed by depositing flowable silicon oxide using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process to remove the patterned hard mask layers 340 and 343 and portions of the layers of nitride, oxide, and insulating materials for layers 138A-138C to substantially coplanarize top surfaces of the layers of nitride, oxide, and insulating materials with top surface 108s (FIGS. 4A-4C) of fin structure 108. The CMP process can be followed by the etching process to etch back the layers of nitride, oxide, and insulating materials to form the structure of FIG. 4A.

The etch back of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the wet etch process can each range from about 10 sccm to about 100 sccm. In some embodiments, the wet etch process can be performed at a pressure ranging from about 5 mTorr to about 100 mTorr and a high temperature ranging from about 50° C. to about 120° C.

In some embodiments, first and second protective liners 138A-138B can have respective thicknesses 138At and 138Bt ranging from about 1 nm to about 2 nm. In some embodiments, STI regions 138 can have a vertical dimension $138_H$ (e.g., height) along a Z-axis ranging from about 40 nm to about 60 nm. In some embodiments, vertical dimension $138_H$ can be half of the total height $H_T$ of fin structure 108. Other materials, formation methods, and dimensions for STI regions 138 are within the scope and spirit of this disclosure.

Referring to FIG. 2, in operation 215, a protective oxide layer is formed on the fin structure and polysilicon structures are formed on the protective oxide layer. For example, as shown in FIGS. 5A-5D, a protective oxide layer 134* can be formed on fin structure 108 and STI regions 138 and polysilicon structures 112A*-112B* can be formed on protective oxide layer 134*. The formation of protective oxide layer 134* can include blanket depositing a layer of oxide material on the structure of FIG. 4A followed by a high temperature anneal process. Protective oxide layer 134* can include a suitable oxide material, such as silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be deposited using PEALD at an energy ranging from about 400 W to about 500 W and at a temperature ranging from about 300° C. to about 500° C. The deposition of the layer of oxide material can be followed by a dry anneal process under oxygen gas flow at a temperature ranging from about 800° C. to about 1050° C. The oxygen precursor concentration can be in a range of about 0.5% to about 5% of the total gas flow rate. In some embodiments, the anneal process can be a flash process where the anneal time can be between about 0.5 s to about 5 s.

In some embodiments, protective oxide layer 134* can have a vertical dimension 134t* (e.g., thickness on top surface of fin structure 108) along a Z-axis and a horizontal dimension 134s* (e.g., thickness on sidewalls of fin top portion 108B) along a Y-axis each ranging from about 1 nm to about 3 nm. In some embodiments, dimension 134t* can be equal to or greater than dimension 134s*. Other oxide materials, formation methods, and thicknesses for protective oxide layer 134* are within the scope and spirit of this disclosure. The presence of protective oxide layer 134* allow etching polysilicon from high aspect ratio spaces 646 (e.g., aspect ratio greater than 1:15, 1:18, or 1:20) shown in FIG. 5A between adjacent polysilicon structures 112A*-112B* without substantially etching and/or damaging fin structure 108 during the formation of polysilicon structures 112A*-112B*.

In some embodiments, protective oxide layer 134* can be removed during subsequent gate replacement process when finFETs 102A-102B are used as non-input/output (non-I/O) devices in core circuits (can be also referred to as "logic circuits" or "memory circuits") formed in core regions (can be also referred to as "logic regions" or "memory regions") of an integrated circuit (IC). In some embodiments, the non-I/O devices can be core devices, logic devices, and/or memory devices that are not configured to handle the input/output voltages/currents directly. In some embodiments, the non-I/O devices includes logic gates such as, for example, NAND, NOR, INVERTER, or a combination thereof. In some embodiments, the non-I/O devices include a memory device, such as a static random-access memory (SRAM) device. In some embodiments, protective oxide layer 134* may not be removed and can form a part of gate dielectric layers of gate structures 112 when finFETs 102A-102B are used as an I/O device in peripheral circuits (e.g., IO circuits) formed in peripheral regions (can be also referred to as "I/O regions" or "high voltage regions") of an IC. The I/O devices can be configured to handle the input/output voltages/currents of the IC and to tolerate a greater amount of voltage or current swing than the non-I/O devices.

The formation of protective oxide layer 134* can be followed by the formation of polysilicon structures 112A*-112B* as shown in FIGS. 5A-5D. During subsequent processing, polysilicon structures 112A*-112B* can be replaced in a gate replacement process to form gate structures 112 of finFETs 102A and 102B, respectively, as shown in FIG. 1A. In some embodiments, the formation of polysilicon structures 112A*-112B* can include blanket depositing a layer of polysilicon material on the deposited protective oxide layer 134* and etching the layer of polysilicon material through a patterned hard mask layer 644 (shown in FIGS. 5A-5D) formed on the layer of polysilicon material. In some embodiments, polysilicon material can be undoped and hard mask layer 644 can include an oxide layer and/or a nitride layer. The oxide layer can be formed using a thermal oxidation process and the nitride layer can be formed by LPCVD or PECVD. Hard mask layer 644 can protect polysilicon structures 112A*-112B* from subsequent processing steps (e.g., during formation of spacers 114, epitaxial fin regions 110, and/or ILD layer 118).

The blanket deposition of the layer of polysilicon material can include CVD, PVD, ALD, or other suitable deposition processes. In some embodiments, etching of the deposited layer of polysilicon material can include a dry etch, a wet etching, or a combination thereof. In some embodiments, etching of the deposited layer of polysilicon material to form polysilicon structures 112A*-112B* can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above fin structure 108. The second, third, and fourth polysilicon etch steps are used to etch unwanted portions of the blanket deposited layer of polysilicon material within high aspect ratio spaces 646.

In some embodiments, vertical dimensions $G_H$ of polysilicon structures 112A*-112B* along a Z-axis can be in a range from about 100 nm to about 150 nm. In some embodiments, horizontal dimensions $G_L$ of polysilicon structures 112A*-112B* along an X-axis can be in a range from about 3 nm to about 30 nm. Polysilicon structures 112A*-112B* can have a high aspect ratio equal to or greater than about 9, where aspect ratio is a ratio of dimension $G_H$ to dimension $G_L$. In some embodiments, horizontal dimensions 648 along an X-axis (e.g., spacing) between adjacent polysilicon structures 112A*-112B* can be in a range from about 40 nm to about 90 nm. The sum of a value of dimension 648 and a value of dimension $G_L$ is referred to as "one contacted poly pitch (1CPP)." In some embodiments, horizontal dimension $L_1$ of fin structure along an X-axis can be at least 3CPP to prevent the relaxation of strain in fin structure 108, and consequently, prevent the relaxation of strain in channel regions formed in stacked fin portions of second semiconductor layers 122 under gate structures 112 as discussed above.

Referring to FIG. 2, in operation 220, spacers are formed on sidewalls of the polysilicon structures. For example, as shown in FIGS. 6A-6D, spacers 114 can be formed on sidewalls of polysilicon structures 112A*-112B*. The formation of spacers 114 can include blanket depositing a layer of an insulating material (e.g., an oxide, a nitride, and/or silicon carbon oxynitride material) on the structure of FIG. 5A by a CVD, a PVD, or an ALD process followed by photolithography and an etching process (e.g., reactive ion etching or other dry etching process using a chlorine or fluorine based etchant). Spacers 114 can each have a horizontal dimension $S_t$ (e.g., thickness) along an X-axis ranging from about 5 nm to about 12 nm, according to some embodiments. The formation of spacers 114 can be followed by the formation of oxide layer 134 (shown in FIGS. 6A-6D) underlying polysilicon structures 112A*-112B* by etching protective oxide layer 134* from regions not covered by polysilicon structures 112A*-112B* and spacers 114. The etch process can include a wet etch process using, for example, diluted HF.

Referring to FIG. 2, in operation 225, first negative capacitance spacer structures are formed in the fin structure. For example, FIGS. 6A-11C show the formation of first NC spacer structures 121 (also referred to as inner spacer structures 121) in the fin structure 108. The formation of first NC structures 121 can include (i) vertical etch back of portions of fin top portion 108B* that are not underlying spacers 114 and polysilicon structures 112A*-112B*, (ii) formation of NC dielectric layers 123, (iii) formation of non-NC dielectric layers 127, and (iv) formation of air gaps 129.

Referring to FIGS. 6A-6C, the vertical etch back of portions of fin top portion 108B* that are not underlying spacers 114 and polysilicon structures 112A*-112B* can include a biased etching process to etch back these portions of fin top portion 108B*. The biased etching process can be performed under a pressure in a range of about 1 mTorr to about 1000 mTorr, a power in range of about 50 W to about 1000 W, a bias voltage in a range of about 20 V to about 500 V, at a temperature in a range of about 40° C. to about 60° C., and using HBr and/or $Cl_2$ as etch gases. During the biased etching process, polysilicon structures 112A*-112B* can be protected from being etched by hard mask layer 644 and spacers 114.

The vertical etch back of the portions of fin top portion 108B* can be followed by a lateral etch back of portions of first semiconductor layers 320 below polysilicon structures 112A*-112B* and spacers 114 to form recessed regions 720, as shown in FIGS. 7A-7B. The lateral etch back can be performed by a dry etching process, a wet etching process, or a combination thereof. The etching process can include a plurality of cycles of etching and purging processes, such as about 3 to about 20 cycles of etching and purging processes. The etching process in each cycle can include using a gas mixture having hydrogen fluoride (HF), nitrogen trifluoride ($NF_3$), a fluorine based gas and a chlorine based gas. The gas ratio of the gas mixture of HF and $NF_3$ to the fluorine based gas can range from about 2 to about 30. The gas ratio of the gas mixture HF and $NF_3$ to the chlorine based gas can range from about 2 to about 40. The purging process in each cycle can include using a gas mixture having HF and nitrogen ($N_2$). HF in the purging process can remove by-product and/or clean the surface of etched portions for subsequent cycles. The purging process can be longer than the etching process in each cycle.

The recessed regions 720 can each have a dimension 119d (e.g., depth) along an X-axis in a range from about 6 nm to about 12 nm. The recessed regions 720 can extend deeper than the side of spacer 114 facing polysilicon structures 112A*-112B*, as shown in FIGS. 7A-7B. Dimension 119d can be greater than thickness St of spacers 114 by about 0.5 nm to about 2 nm. In some embodiments, a lateral distance 119e between the end of recessed regions 720 and the side of spacer 114 adjacent to polysilicon gate 112B* can range from about 0.5 nm to about 2 nm. A ratio between dimension 119d and thickness St can range from about 1.1 to about 1.5 to ensure 119d is larger than St. Etching recessed regions 720 deeper than spacers 114 by lateral distance 119e can prevent any residual portions of first semiconductor layer 320 under spacers 114 during the removal of first semiconductor layer 320 during subsequent gate replacement process described below. Other etching methods for forming recessed regions 720 and dimensions of recessed regions 720 are within the scope and spirit of this disclosure.

The formation of recessed regions 720 can be followed by coating of recessed regions 720 with interfacial layer (not shown) and a blanket deposition of an NC dielectric material layer 123*, as shown in FIGS. 7A-7C. In subsequent processing, NC dielectric material layer 123* can form NC dielectric layer 123 as described with reference to FIGS. 1A-1E. In some embodiments, the interfacial layer (IL) can include silicon oxide with a thickness ranging from about 0.5 nm to about 1 nm and can be formed during a chemical clean process. The IL can help the growth of NC dielectric material layer 123* during its deposition.

NC dielectric material layer 123* can include NC materials described for NC dielectric layers 123 with reference to FIGS. 1A-1E. NC dielectric material layer 123* can be blanket deposited by thermal ALD with a temperature ranging from about 180° C. to about 325° C. In some embodiments, the thermal ALD can use two precursors, one for the deposition of $HfO_2$, and another for the doping of $HfO_2$. Thickness 123t of NC dielectric material layer 123* can range from about 2.2 nm to about 3 nm similar to NC dielectric layers 123. Other methods of coating recessed regions 720, depositing NC dielectric material layer 123*, and dimensions of IL and NC dielectric material layer 123* are within the scope and spirit of this disclosure.

Figures 8A, 8B, 8C:
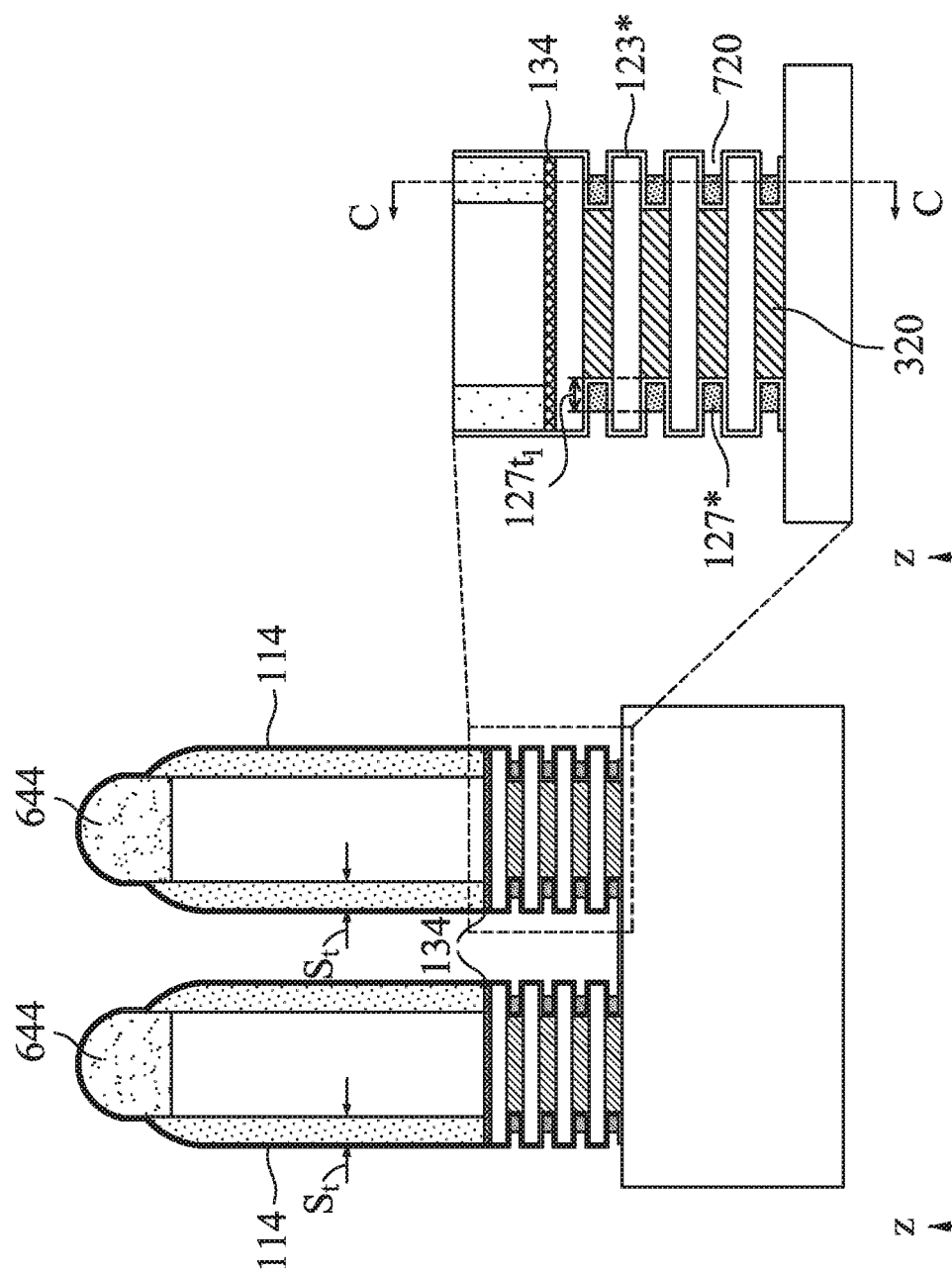

The blanket deposition of NC dielectric material layer 123* can be followed by a blanket deposition of a non-NC dielectric material layer on the structure of FIG. 7A. The blanket deposition can be followed by a lateral etch of the blanket deposited non-NC dielectric material layer to form non-NC dielectric layers 127* on portions of NC dielectric material layer 123* within recessed regions 720, as shown in FIGS. 8A-8C. In some embodiments, the blanket deposition process can include a plurality of cycles of deposition and etch processes. In each cycle, the etch process can follow the deposition process to prevent the formation of voids within non-NC dielectric layers 127* by removing seams that can be formed during deposition of non-NC dielectric material layer within recessed regions 720.

Non-NC dielectric layers 127* can include a single layer or a stack of dielectric layers, deposited by ALD, FCVD, or other suitable methods. The etch process in each cycle of the blanket deposition process of non-NC dielectric material layer can include a dry etch process using a gas mixture of HF and $NH_3$. The gas ratio of HF to $NH_3$ can range from about 1 to about 20.

Non-NC dielectric layers 127* can include a non-NC dielectric material composed of silicon, oxygen, carbon, and/or nitrogen similar to the non-NC dielectric material described for non-NC dielectric layers 127 with reference to FIGS. 1A-1E. Carbon concentration can be low in the non-NC dielectric material and range from about 1% to about 15% because carbon concentration in the non-NC dielectric material outside this range can lead to longer etch time, reduced etch selectivity between NC dielectric layer 123* and the non-NC dielectric material, and/or damage to fin structure 108.

The lateral etch process of the blanket deposited non-NC dielectric material layer to form non-NC dielectric layers 127* can be performed by a dry etch process using a gas mixture of HF and $NH_3$. The gas ratio of HF to $NH_3$ can range from about 1 to about 20. In some embodiments, non-NC dielectric layers 127* can have a dimension $127t_1$ (e.g., thickness) along an X-axis ranging from about 3 nm to about 12 nm. Other methods of deposition and lateral etch process for the formation of non-NC dielectric layers 127*, and dimensions of non-NC dielectric layers 127* are within the scope and spirit of this disclosure.

The formation of non-NC dielectric layers 127* can be followed by an etch process to form NC dielectric layer 123 within recessed regions 720, as shown in FIGS. 9A-9C. Thus, the formation of NC dielectric layers 123 can include the blanket deposition of NC dielectric material layer 123* and the etch process. In some embodiments, the etch process to form NC dielectric layer 123 can include a wet etch process using diluted HF (DHF).

The formation of non-NC dielectric layers 123 can be followed by a lateral etch of non-NC dielectric layers 127* to form non-NC dielectric layers 127 on NC dielectric layers 123 within recessed regions 720, as shown in FIGS. 10A-10B. Thus, the formation of non-NC dielectric layers 127 can include the formation of non-NC dielectric layers 127* and the lateral etch process. In some embodiments, the lateral etch of non-NC dielectric layers 127* can include a dry etch process using a gas mixture of HF and $NH_3$. The gas ratio of HF to $NH_3$ can range from about 1 to about 20. The gas ratio can be selected to have a high etch selectivity between NC dielectric layer 123 and non-NC dielectric layers 127*.

After the lateral etch process, non-NC dielectric layers 127 can have a thickness 127t ranging from about 3 nm to about 6 nm. A ratio between thickness 127t and dimension 119d can range from about 0.25 to about 1. Air gaps 129 can be formed with a thickness 129t ranging from about 2 nm to about 3 nm within recessed regions 720 after the formation of epitaxial fin regions 110 on second semiconductor layers 122 as described in operation 230 with reference to FIGS. 11A-11C. The formation of NC dielectric layers 123, non-NC dielectric layers 127, and air gaps 129 can form first NC spacer structures 121 as shown in FIG. 10B.

Referring to FIG. 2, in operation 230, epitaxial fin regions are formed on the fin structure and nanowires are formed between the epitaxial fin regions. For example, as shown in FIGS. 11A-11C, epitaxial fin regions 110 can be grown on exposed surfaces of fin base portion 108A and on exposed surfaces of second semiconductor layers 122 of the structure of FIG. 10A. In some embodiments, a portion of epitaxial fin regions 110 can be under spacers 114 and/or extend into fin base portion 108A. In some embodiments, epitaxial fin regions 110 can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110 can be grown by an epitaxial deposition/partial etch process, which repeats the epitaxial deposition/partial etch process at least once. In some embodiments, epitaxial fin regions 110 can be grown by selective epitaxial growth (SEG), where an etching gas is added to promote the selective growth of semiconductor material on the exposed surfaces of second semiconductor layers 122 and fin base portion 108A, but not on insulating material (e.g., insulating material of STI regions 138, of first NC spacer structures 121 and/or of spacers 114).

In some embodiments, epitaxial fin regions 110 can be p-type or n-type. In some embodiments, p-type epitaxial fin regions 110 can include SiGe and can be in-situ doped during the epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type epitaxial fin regions 110 can include Si without any substantial amount of Ge and can be in-situ doped during the epitaxial growth process using n-type dopants, such as phosphorus or arsenic. For n-type in-situ doping, n-type doping precursors such as, but not limited to, phosphine ($PH_3$), arsine ($AsH_3$), and/or other n-type doping precursor can be used.

Each epitaxial fin region 110 can form S/D regions for finFETs 102A and/or 102B. Second semiconductor layers 122 underlying polysilicon structures 112A*-112B* and interposed between adjacent S/D regions can form the channel regions of finFETs 102A and/or 102B. In subsequent processing, gate-all-around (GAA) structures can be formed to wrap around each of the channel regions by replacing first semiconductor layers 320 (shown in FIG. 10A) of stacked fin portions $108B_1$ and $108B_2$ underlying polysilicon structures 112A*-112B* with one or more layers of gate structures 112 as described below in operations 235 and 240.

In some embodiments, fin base portion 108A underlying the etched portions of fin top portion 108B between spacers 114 can be recessed during the vertical etch back process described in operation 225. Interfaces 848 between epitaxial fin regions 110 and fin base portion 108A can be on the same plane as top surfaces of STI regions 138 or can be below the top surface planes of STI regions 138. Other dimensions and structures for epitaxial fin regions 110 are within the scope and spirit of this disclosure.

The formation of epitaxial regions 110 can be followed by the removal of first semiconductor layers 320 of stacked fin portions 108B1 and 108B2 to form nanowire shaped second semiconductor layers 122, as shown in FIGS. 11A-11C. First semiconductor layers 320 can be removed by an etching process performed under a pressure in a range of about 1 mTorr to about 1000 mTorr, a power in range of about 50 W to about 1000 W, a bias voltage in a range of about 20 V to about 500 V, at a temperature in a range of about 40° C. to about 60° C., and using HBr and/or $Cl_2$ as etch gases. Other etching methods are within the scope and spirit of this disclosure.

The removal of first semiconductor layers 320 can be followed by the formation of an etch stop layer (ESL) (not shown) on spacers 114 and on epitaxial fin regions 110 and the formation of ILD layer 118 on the ESL using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using FCVD process. The deposition process can be followed by a thermal annealing of the deposited layer of dielectric material in steam at a temperature ranging from about 200° C. to about 700° C. for a period ranging from about 30 minutes to about 120 minutes.

The formation of ILD layer 118 can be followed by the removal of polysilicon structures 112A*-112B* using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon structures 112A*-112B*, or a dry etch followed by a wet etch process can be used to remove polysilicon structures 112A*-112B*. The exposed portions of oxide layer 134 can be removed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. In some embodiments, oxide layer 134 may not be removed.

Figures 12A, 12B, 12C:
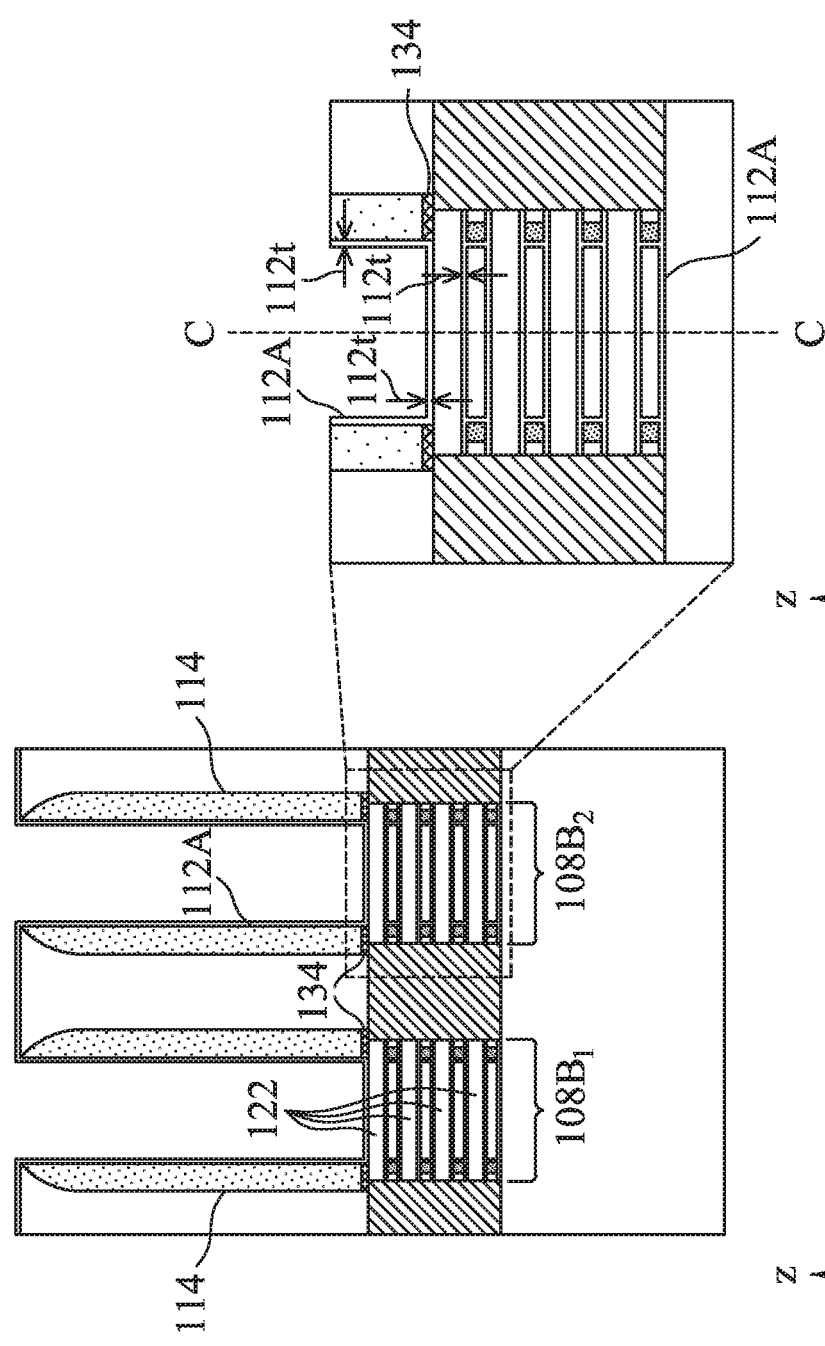

Referring to FIG. 2, in operation 235, NC gate dielectric layers are formed on the nanowires. For example, as shown in FIGS. 12A-12C, NC gate dielectric layers 112A can be wrapped around on exposed nanowire shaped second semiconductor layers 122 of stacked fin portions $108B_1$ and $108B_2$. The formation of NC gate dielectric layers 112A can include a blanket deposition process of an NC dielectric material layer similar to the blanket deposition process for forming NC dielectric layer 123. The NC dielectric material layer for NC gate dielectric 112A can be blanket deposited on the structure of FIG. 11A. NC gate dielectric layer 112A can be formed with a thickness 112t ranging from about 2 nm to about 3 nm. A ratio between thickness 122t of semiconductor layers 122 and thickness 112t of NC gate dielectric layer 112A can range from about 2 to about 5. The NC dielectric material of NC gate dielectric layer 112A are described above with reference to FIGS. 1A-1E. Other deposition methods and dimensions of NC gate dielectric layers 112A are within the scope and spirit of this disclosure.

Figures 13A, 13B, 13C:
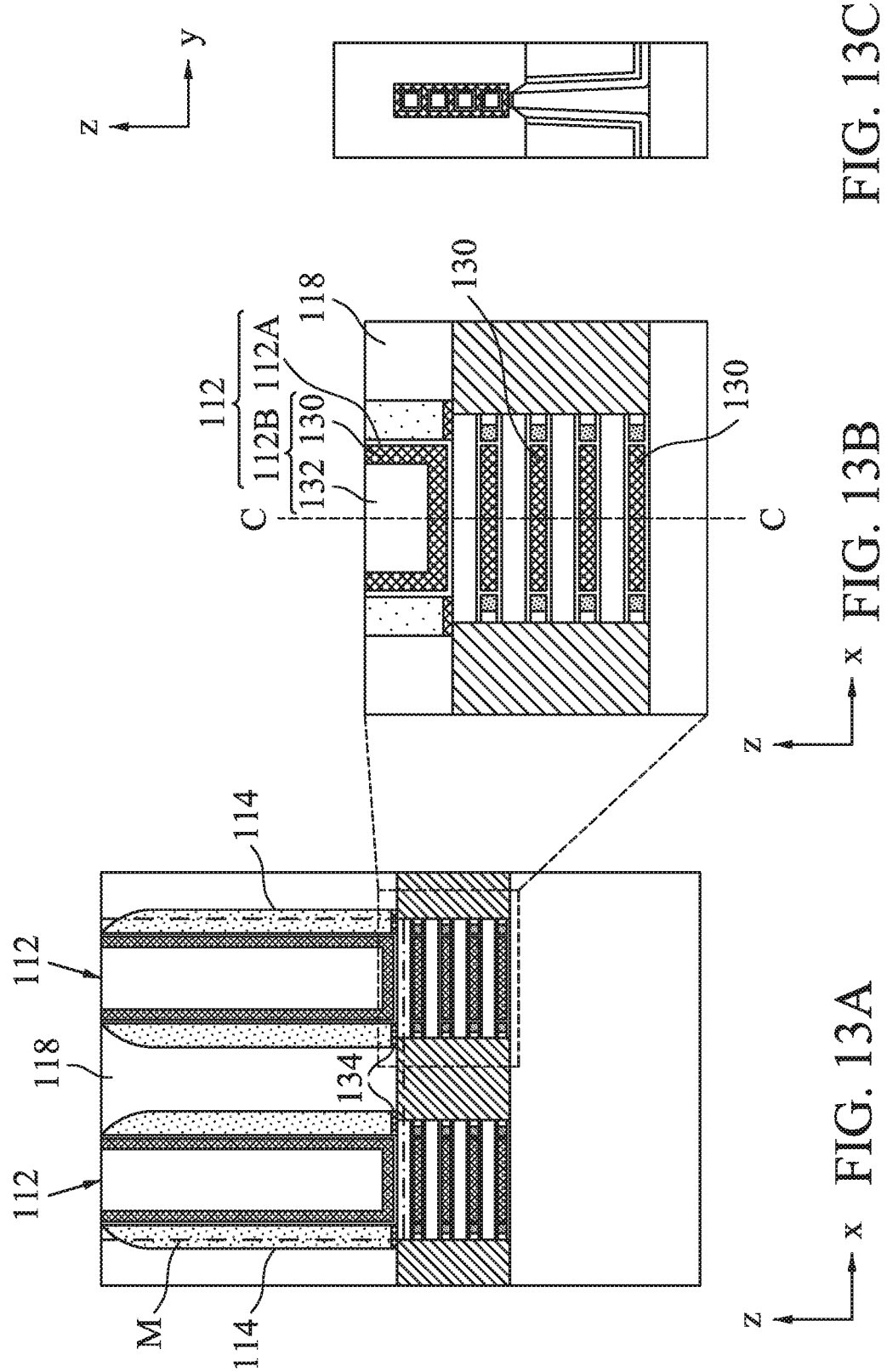

Referring to FIG. 2, in operation 240, gate electrodes are formed on NC gate dielectric layers. For example, as shown in FIGS. 1A-1D, and 13A-13C, a layer of work function metal for gate work function layers 130, and a layer of conductive material for gate metal fill layers 132 on the layer of work function metal can be formed on NC gate dielectric layers 112A. In some embodiments, as shown in FIG. 13C, NC gate dielectric layers 112A and gate work function layers 130 can each wrap around nanowire shaped second semiconductor layers 122 formed as a result of the removal of first semiconductor layers 320.

The layer of work function metal for work function layers 130 can include Al, Cu, W, Ti, Ta, TiN, TaN, NiSi, CoSi, Ag, TaC, TaSiN, TaCN, TiAl, TiAlN, WN, metal alloys, and/or combinations thereof. In some embodiments, the layer of work function metal can include Al-doped metal, such as Al-doped Ti, Al-doped TiN, Al-doped Ta, or Al-doped TaN. The layer of work function metal can be deposited using a suitable process such as ALD, CVD, PVD, plating, or combinations thereof. The layer of conductive material for gate metal fill layers 132 can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof and can be formed by ALD, PVD, CVD, or other suitable deposition processes. The deposited layers of NC gate dielectric material, work function metal, and conductive material can be planarized by a CMP process to form the structure of FIG. 13A. The CMP process can substantially coplanarize top surfaces of NC gate dielectric layers 112A, gate work function layers 130, and gate metal fill layers 132 with top surfaces of ILD layers 118 as shown in FIG. 13A.

Referring to FIG. 2, in operation 245, second NC spacer structures are formed on the spacers on the gate structures. For example, FIGS. 14A-14B show the formation of second NC spacer structures 1439, which includes the formation of NC dielectric layers 1440 and nitride layers 1442. FIG. 14A is a zoomed-in view of area M of FIG. 13A after the etch back of spacers 114, NC gate dielectric layers 112A, gate work function layers 130, and gate metal fill layers 132, the formation of self-aligned contact (SAC) dielectric layers 1444, and removal of portions of ILD layer 118 on epitaxial fin region 110 between gate structures 112, as shown in FIG. 14A. The views of semiconductor device 100 are shown for illustration purposes and may not be drawn to scale.

The formation of NC dielectric layers 1440 can include blanket deposition of an NC dielectric material layer 1440* on spacers 114, exposed surface of epitaxial fin region 110, and SAC dielectric layers 1444 as shown in FIG. 14A. NC dielectric material layer 1440* can be blanket deposited by a thermal ALD process similar to the process used for the formation of NC dielectric layers 123 and/or NC gate dielectric layer 112A described above. NC dielectric material layer 1440* can be formed with a thickness 1440t ranging from about 2.2 nm to about 3 nm A ratio between spacer thickness St and thickness 1440t can range from about 2 to about 5. NC dielectric material layer 1440* can include NC dielectric material similar to the NC dielectric material of NC gate dielectric layers 112A, or other NC dielectric materials described above. In some embodiments, SAC dielectric layers 1444 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof.

The formation of NC dielectric material layer 1440* can be followed by formation of nitride layers 1442, as shown in FIG. 14A. In some embodiments, nitride layers 1442 can include, for example, $SiN_x$, SiON, SiCN, or other suitable materials. Nitride layers 1442 can protect NC dielectric layer 1440 and/or spacers 114 during formation of S/D contact structures 1448 (shown in FIG. 14C). The formation of nitride layers 1442 can include blanket deposition of a layer of nitride material on NC dielectric material layer 1440* using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods.

The formation of nitride layers 1442 can further include an etching process to remove portions of the blanket deposited layer of nitride material from portion of NC dielectric material layer 1440* on epitaxial fin region 110, from top surfaces and side surfaces of NC dielectric material layer 1440* on SAC dielectric layers 1444. After the etching process, nitride layers 1442 can be vertically displaced from top surfaces of NC dielectric material layer 1440* by a distance 1442d that can range from about 10 nm to about 25 nm. Each nitride layers 1442 can have a thickness ranging from about 1.5 nm to about 2 nm.

The formation of NC dielectric layers 1440 can further include removal of portions of NC dielectric material layer 1440* on top surfaces of SAC dielectric layers 1444 and epitaxial fin region 110, as shown in FIG. 14B. The removal process can follow the etching process to form nitride layers 1442 and can include a dry etch process. In some embodiments, semiconductor device 100 can be formed without NC dielectric layer 1440, thus the steps of forming NC dielectric layer 1440 can be optional. In some embodiments, a recessed region 1410 (shown in FIG. 14B) can be formed in epitaxial region 110 during the removal of NC dielectric material layer 1440* from top surface of epitaxial region 110.

Referring to FIG. 2, in operation 250, S/D and gate contact structures are formed. For example, FIG. 14C show the formation of S/D contact structure 1448 and gate contact structure 1450 after the formation of NC dielectric layers 1440 in FIG. 14B. The formation of S/D contact structure 1448 can include the formation of metal silicide layer 1446 within recessed region 1410 of epitaxial fin region 110 and metal contact 1447 on metal silicide layer 1446 as shown in FIG. 14C. The formation of metal silicide layer 1446 can include deposition of a metal layer within recessed region 1410 and silicidation of the deposited metal layer. The formation of metal contact 1447 can include deposition of a contact metal followed by CMP of the deposited contact metal. The conductive materials for the metal layer and/or the contact metal can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof and can be formed by ALD, PVD, CVD, or other suitable deposition processes.

The formation of S/D contact structure 1448 can be followed by the formation of gate contact structure 1450 on gate structure 112 as shown in FIG. 14C. In some embodiments, the formation of gate contact structures 1450 can include forming a contact opening in which metal contact can be deposited by ALD, PVD, CVD, or other suitable deposition processes followed by CMP of the deposited contact metal.

The present disclosure provides example NC dielectric layers (e.g., NC gate dielectric layers 112A, NC dielectric layers 1440 on spacers 114, and NC dielectric layers 123 between epitaxial fin regions 110 and gate structures 112) in FET devices (e.g., finFETs 102A-102B) and/or in an integrated circuit (IC) and example methods for fabricating the same.

The example methods can form FET devices having gate structures 112 with NC gate dielectric layers 112A. In some embodiments, the NC materials can include a dielectric material with ferroelectric properties, a dielectric material in orthorhombic phase (e.g., hafnium oxide ($HfO_2$) in orthorhombic phase), and/or a dielectric material (e.g., HfO2) doped with one or more metals, such as aluminum (Al), calcium (Ca), cerium (Ce), dysprosium (Dy), Erbium (Er), gadolinium (Gd), germanium (Ge), lanthanum (La), scandium (Sc), silicon (Si), strontium (Sr), stannum (Sn), yttrium (Y), zirconium (Zr), or a combination thereof. The NC gate dielectric layers 112A can reduce subthreshold swing (SS) through internal voltage amplification mechanism and increase channel on-current to off-current (Ion/Ioff) ratio of the devices. The reduction of SS in the FET devices can achieve faster device operation along with lower switching energy, and can effectively scale down the supply voltage and significantly lower the power consumption in these FET devices.

In some embodiments, the example methods can form first and second NC spacer structures 121 and 1439, respectively, between gate structures 112 and source/drain (S/D) regions 110 of the FET devices to reduce parasitic capacitances between them. The parasitic capacitance can arise from an electrical coupling between one signal line and another signal line or a signal line and substrate 106 of the FET devices and can negatively impact device performance at high frequencies. In some embodiments, the first NC spacer structure 121 can be disposed between epitaxial S/D region 110 and a portion of the gate structure 112 and can include an NC dielectric layer 123, a non-NC dielectric layer 127, and an air-gap 129. In some embodiments, the second NC spacer structure 1439 can be disposed between a S/D contact structure 1448 and the gate structure 112 and can include an NC dielectric layer 1440 and a nitride layer 1442.

In some embodiments, a method of fabricating a semiconductor device includes forming a fin structure with a fin base portion and a fin top portion on a substrate, forming a spacer structure in a first region of the fin top portion, and forming a gate structure on a second region of the fin top portion. The spacer structure includes a first NC dielectric material and the gate structure includes a gate dielectric layer with a second NC dielectric material different from the first NC dielectric material.

In some embodiments, a method of fabricating a semiconductor device includes forming a fin structure with a stacked fin portion and a fin base portion on a substrate, forming an epitaxial source/drain region on the fin structure, and forming a first negative capacitance (NC) dielectric structure in a first region of the stacked fin portion. The stacked fin portion is epitaxially grown on the fin base portion. The first NC dielectric structure includes a first dielectric layer with a first NC material. The method further includes forming gate structures on a second region of the stacked fin portion, forming a source/drain contact structure on the epitaxial source/drain region, and forming a second NC dielectric structure between the source/drain contact structure and the gate structures. The gate structures each includes a second dielectric layer with the first NC material. The second NC dielectric structure includes a third dielectric layer with the first NC material.

In some embodiments, a semiconductor device includes a fin structure with a fin base portion and a fin top portion on a substrate, a spacer structure disposed in a first region of the fin top portion, and a gate structure disposed on a second region of the fin top portion. The spacer structure includes a first NC dielectric material and the gate structure includes a gate dielectric layer with a second NC dielectric material different from the first NC dielectric material.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
    forming a fin structure with a fin base portion and a fin top portion on a substrate;
    forming a spacer structure in a first region of the fin top portion, wherein the spacer structure comprises a first negative capacitance (NC) dielectric layer comprising an NC dielectric material, a non-NC dielectric structure and an air gap within the first NC dielectric layer; and
    forming a gate structure on a second region of the fin top portion,
    wherein the gate structure comprises a gate dielectric layer with a second NC dielectric material different from the first NC dielectric material.

2. The method of claim 1, wherein the forming the spacer structure comprises:
    forming a recessed region in the first region of the fin top portion; and
    depositing a layer of the first NC dielectric material in the recessed region.

3. The method of claim 2, wherein the depositing the layer of the first NC dielectric material comprises:
    depositing a layer of high-k dielectric material;
    doping the layer of high-k dielectric material with a conductive material.

4. The method of claim 1, wherein the forming the spacer structure comprises:
    forming a recessed region in the first region of the fin top portion;
    depositing a layer of the first NC dielectric material to line sides of the recessed region; and
    forming the non-NC dielectric structure and the air gap on the layer of the first NC dielectric material within the recessed region.

5. The method of claim 4, wherein the forming the non-NC dielectric structure and the air gap comprises:
    depositing a layer of non-NC dielectric material to substantially fill an area of the recessed region lined with the layer of the first NC dielectric material;
    etching back the layer of non-NC dielectric material; and epitaxially growing a source/drain region on the fin base portion and the first region of the fin top portion, wherein the source/drain region covers an opening of the recessed region and forms the air gap between the source/drain region and the etched backed layer of non-NC dielectric material.

6. The method of claim 1, wherein the forming the gate structure comprises etching a fin portion in the second region of the fin top portion, and wherein the fin portion is adjacent to the spacer structure.

7. The method of claim 1, wherein the forming the gate structure comprises depositing a layer of the second NC dielectric layer on the second region of the fin top portion, and wherein the second region is adjacent to the spacer structure.

8. The method of claim 7, wherein the depositing the layer of the second NC dielectric layer comprises:

depositing a layer of hafnium oxide; and doping the layer of hafnium oxide with a metal.

9. The method of claim 1, wherein the forming the gate structure comprises depositing the layer of the second NC dielectric layer wrapped around the second region of the fin top portion.

10. The method of claim 1, wherein the forming the gate structure comprises depositing a work function metal layer wrapped around the second region of the fin top portion.

11. A method of fabricating a semiconductor device, the method comprising:

forming a fin structure with a stacked fin portion and a fin base portion on a substrate, wherein the stacked fin portion is epitaxially grown on the fin base portion;

forming an epitaxial source/drain region on the fin structure;

forming a first negative capacitance (NC) dielectric structure in a first region of the stacked fin portion, wherein the first NC dielectric structure comprises a first dielectric layer with a first NC material;

forming gate structures on a second region of the stacked fin portion, wherein the gate structures each comprises a second dielectric layer with the first NC material;

forming a source/drain contact structure on the epitaxial source/drain region; and forming a second NC dielectric structure between the source/drain contact structure and the gate structures, wherein the second NC dielectric structure comprises a third dielectric layer with the first NC material.

12. The method of claim 11, wherein the forming the first NC dielectric structure comprises:

forming a recessed region in the first region of the stacked fin portion;

depositing a layer of the first NC material within the recessed region; and forming a dielectric structure on the layer of the first NC material within the recessed region.

13. The method of claim 11, wherein the forming the second NC dielectric structure comprises:

forming a trench on the epitaxial source/drain region between the gate structures;

depositing a layer of the first NC material along sides of the trench;

depositing a nitride layer on the layer of the first NC material; and etching back the nitride layer.

14. The method of claim 13, wherein the depositing the layer of the first NC material comprises:

depositing a layer of high-k dielectric material; and doping the layer of high-k dielectric material with a conductive material.

15. The method of claim 13, wherein the depositing the layer of the first NC material comprises:

depositing a layer of hafnium oxide;

doping the layer of hafnium oxide with a metal; and annealing the doped hafnium oxide.

16. A method of fabricating a semiconductor device, the method comprising:

forming a fin structure with a fin base portion and a fin top portion on a substrate;

forming a spacer structure in a first region of the fin top portion, wherein the spacer structure comprises a negative capacitance (NC) dielectric layer comprising an NC dielectric material, a non-NC dielectric structure, and an air gap;

forming a source/drain region on the fin base portion and in contact with the fin top portion, wherein the source/drain region, the NC dielectric layer, and the non-NC dielectric structure enclose the air gap; and forming a gate structure on a second region of the fin top portion, wherein the gate structure comprises a gate dielectric layer having the NC dielectric material.

17. The method of claim 16, wherein the forming the spacer structure comprises:

forming a recessed region in the first region of the fin top portion;

depositing a layer of the NC dielectric material in the recessed region;

depositing a layer of non-NC dielectric material to substantially fill the recessed region;

etching back the layer of non-NC dielectric material to form the non-NC dielectric structure; and etching back the layer of NC dielectric material to form the NC dielectric layer.

18. The method of claim 17, wherein the depositing the layer of the NC dielectric material comprises:

depositing a layer of high-k dielectric material; and doping the layer of high-k dielectric material with a conductive material.

19. The method of claim 17, wherein the depositing the layer of the NC material comprises:

depositing a layer of hafnium oxide;

doping the layer of hafnium oxide with a metal; and annealing the doped layer of hafnium oxide.

20. The method of claim 16, wherein the forming the gate structure comprises:

etching a fin portion in the second region of the fin top portion, wherein the fin portion is adjacent to the spacer structure;

depositing a layer of the NC dielectric material wrapped around the second region of the fin top portion; and depositing a work function metal layer on the gate dielectric layer.

* * * * *